US012627294B1

(12) United States Patent
Flicker et al.

(10) Patent No.: US 12,627,294 B1
(45) Date of Patent: May 12, 2026

(54) HETEROGENEOUS SOLID STATE TRANSFORMERS WITH HIERARCHICAL CONTROL

(71) Applicant: National Technology & Engineering Solutions of Sandia, LLC, Albuquerque, NM (US)

(72) Inventors: Jack D. Flicker, Albuquerque, NM (US); Jacob Mueller, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 23 days.

(21) Appl. No.: 18/902,168

(22) Filed: Sep. 30, 2024

Related U.S. Application Data

(60) Provisional application No. 63/541,109, filed on Sep. 28, 2023.

(51) Int. Cl.
H03K 17/687 (2006.01)
(52) U.S. Cl.
CPC ................................ H03K 17/6871 (2013.01)

(58) Field of Classification Search
CPC .................................................. H03K 17/6871
USPC .................................................. 327/108–112
See application file for complete search history.

(56) References Cited

U.S. PATENT DOCUMENTS

| | | | |
|---|---|---|---|
| 2024/0297598 A1* | 9/2024 | Divan ................... | H02M 3/335 |
| 2025/0125708 A1* | 4/2025 | Duan ................... | H02M 1/0043 |
| 2025/0167685 A1* | 5/2025 | Hwang .............. | H02M 1/0074 |
| 2025/0279730 A1* | 9/2025 | Liu ................... | H02M 3/33573 |

* cited by examiner

*Primary Examiner* — Tomi Skibinski
(74) *Attorney, Agent, or Firm* — Daniel J. Jenkins

(57) ABSTRACT

Structural modularity is critical to solid-state transformer (SST) and solid-state power substation (SSPS) concepts, but operational aspects related to this modularity are not yet fully understood. Previous studies and demonstrations of modular power conversion systems assume identical module compositions, but dependence on module uniformity undercuts the value of the modular framework. A hierarchical control approach for modular SSTs achieves system-level objectives while ensuring equitable power sharing between nonuniform building block modules. This enables module replacements and upgrades which leverage circuit and device technology advancements to improve system-level performance.

11 Claims, 30 Drawing Sheets

Figure 5

HETEROGENEOUS SOLID STATE TRANSFORMERS WITH HIERARCHICAL CONTROL

CROSS-REFERENCE TO RELATED APPLICATIONS

This application claims priority to U.S. Provisional Application No. 63/541,109, filed on Sep. 28, 2023, entitled "Systems, Methods and Tools for Hierarchical Control for Heterogeneous Solid State Transformers," the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD

The present disclosure is generally directed to transformers and more particularly directed to modular solid state transformers utilizing a hierarchical control approach to achieve system-level objectives while ensuring equitable power sharing between nonuniform building block modules.

BACKGROUND

Power grids are undergoing historically unprecedented change. Previously consistent load profiles are being significantly altered by the rapid electrification of transportation systems. Generation is becoming more distributed and intermittent. The rate of utility-scale storage deployment is increasing. All of these changes stem from a common factor: the availability of power electronic devices and systems robust enough to withstand the stresses of utility applications. Power electronics are at the core of the electric drives disrupting aggregate load behavior, the inverters interfacing renewable and distributed energy resources, and the DC power supplies behind all modern telecommunications infrastructure. The emergence of grid-capable power electronics has led to a more dynamic electrical system. Power flow is less predictable, and without the inertia of traditional electromechanical generation, system protection is more challenging.

Power electronics are not the only forces changing the grid. Electrical infrastructure is aging and ill-equipped to support the rapid changes in energy utilization. Simultaneously, power systems are under increasing threat of cyber and physical attack, the effects of electromagnetic pulse (EMP) and geomagnetic disturbance (GMD) events, and increasingly frequent severe weather events. Energy infrastructure is subject to a changing set of stressors, and new tools are needed to ensure the resiliency of tomorrow's energy infrastructure.

Traditionally, control over utility systems has been applied either at the point of generation in large rotating machines, or through binary switching decisions distributed throughout the power system (e.g., relays, transformer tap changers). While this approach was suitable for unidirectional power flow between generation and load, it is strained by the increasing complexity of power flow in modern electrical networks.

What is needed are devices and controls that address the limitations of the prior art.

SUMMARY OF THE DISCLOSURE

The present disclosure is directed to Solid-State Power Substations (SSPS) that leverage power electronics' ability to control the flow of electrical energy. It is specifically focused on utilization of hierarchical control of heterogeneous solid state transformers. SSPS embed points of control throughout distribution systems. The SSPS acts as a hub for interconnection between transmission systems, AC and DC distribution networks, local distributed energy resources, and energy storage assets.

SSPS are a flexible and scalable framework for implementation of new power conversion and control functions and are envisioned as the workhorse of grid modernization. SSPS are not only a solution to known challenges but provide a platform that streamlines the deployment of new solutions to emergent needs of evolving power systems. SSPS achieve this flexibility in voltage and current rating by the interconnection of multiple lower rated modules cascaded in series, for higher voltage operation, or in parallel for higher current operation. SSPS is typically thought to be composed of a homogenous interconnection of modules, where each module is identical.

In this disclosure, a hierarchical control is split between the overarching system and the local, module control that allows for modular SST architectures composed of nonuniform modules in a cascaded configuration. Without this split in hierarchical control, SST modules are forced to be uniform in both device composition as well as circuit topology or the complexity of system increases exponentially with the number of modules. Cascading of SST modules is supremely important for fielded SST operation as this will allow for modular SST blocks to achieve higher voltage scalability for the system.

According to an embodiment of the disclosure, a solid state transformer is disclosed that includes a system controller and a module controller. The system controller generates a module operational setpoint that is provided to the module controller to derive switching signals for a switching module, and the switching module uses a low bandwidth signal, the low bandwidth signal is between 10-300 Hz.

According to another embodiment of the disclosure, a method of controlling power distribution within a power distribution system is disclosed that includes distributing at one or more nodes in the power distribution system a solid state transformer comprising a hierarchical control architecture that enables the stable operation of paralleled and/or series-connected heterogeneous modules in a common system by distributing module-specific (fast-time) controls to individual modules while system-level behavior (slow-time) response is centralized.

An advantage of the present disclosure is to provide system-level objectives while ensuring equitable power and/or voltage sharing between nonuniform building block modules.

BRIEF DESCRIPTION OF THE DRAWINGS

FIG. 5 shows a typical hierarchical control scheme for power electronics systems.

Wherever possible, the same reference numbers will be used throughout the drawings to represent the same parts.

DETAILED DESCRIPTION

Figure 1:
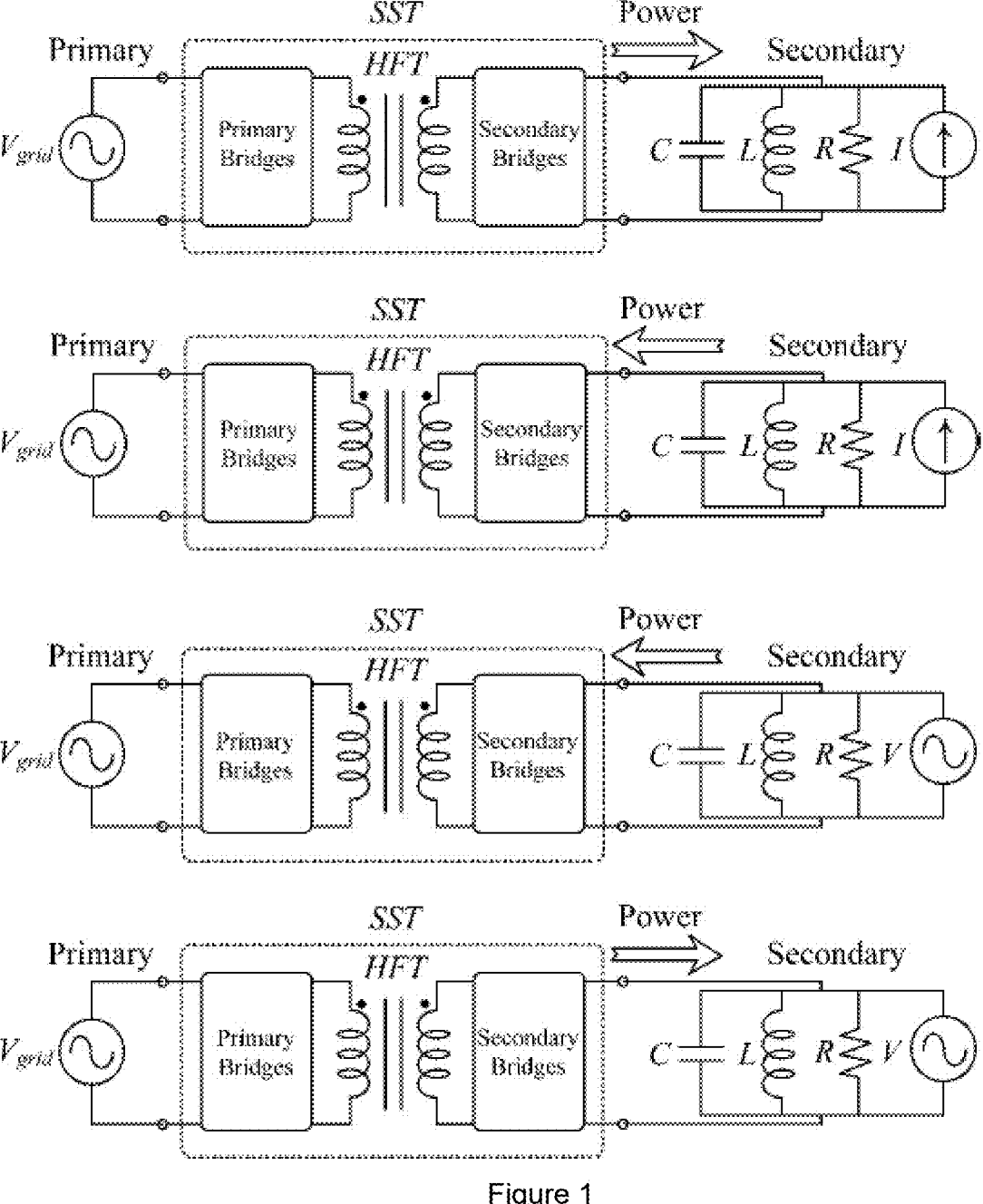
FIG. 1 shows four different cases for SST operation depending on the connection at the secondary side of the SST.
Figures 2A, 2B:
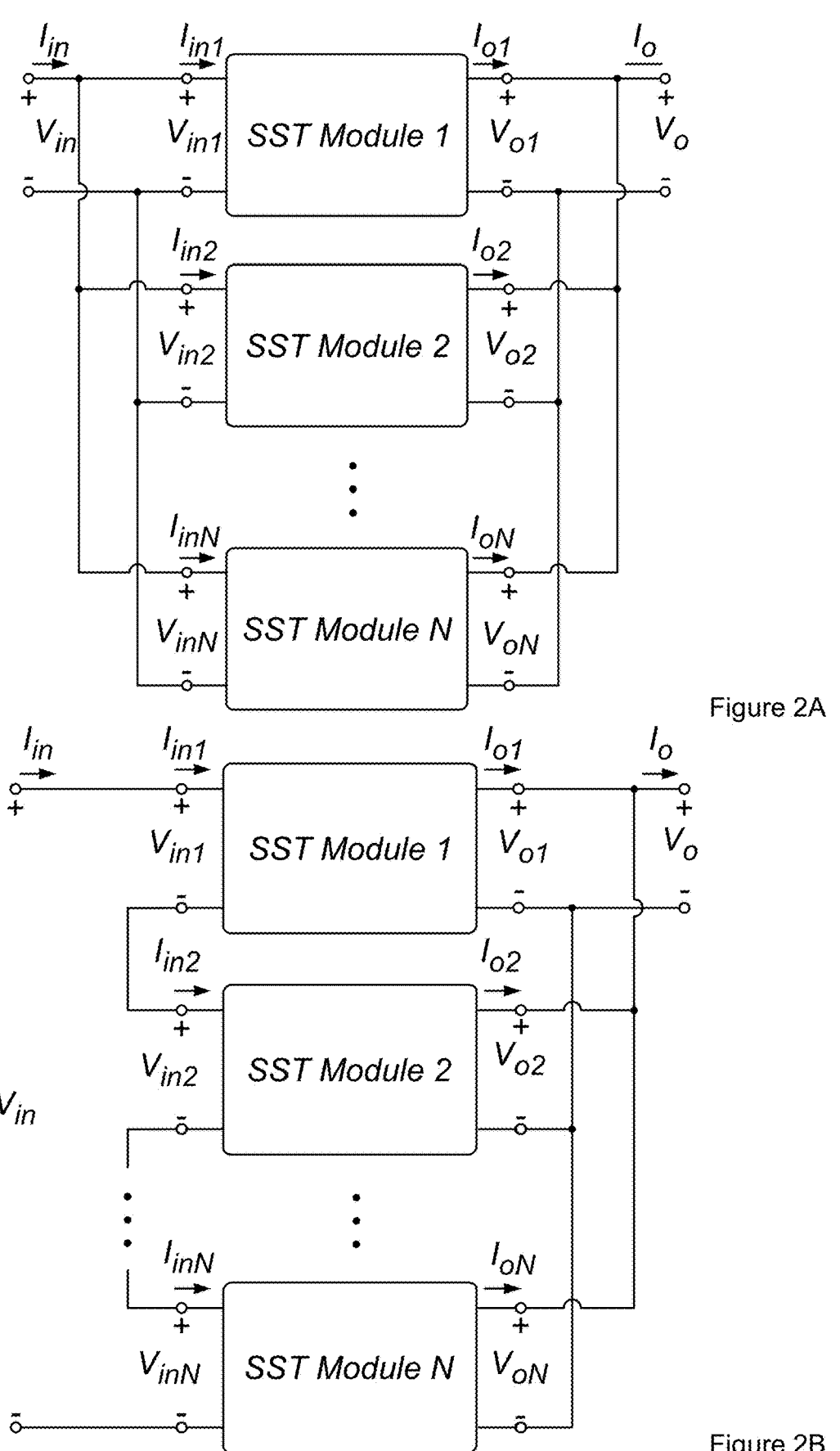
FIGS. 2A, 2B, 2C, and 2D show different possible multi-module topologies.
Figures 2C, 2D:
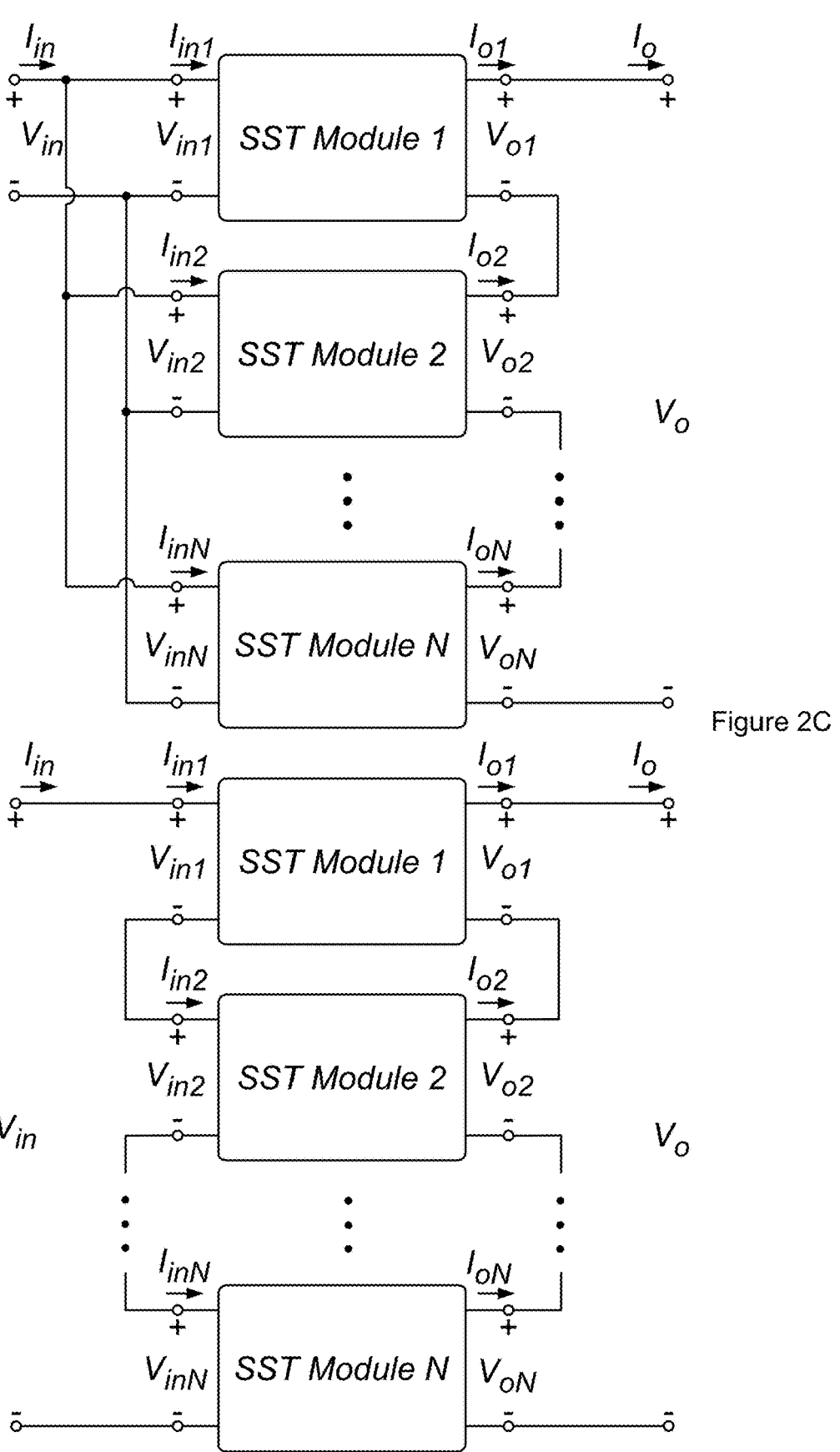

Structural modularity is inherent to the SSPS concept. The applications of SSPS are numerous, and the ranges of voltage and power requirements for SSPS installations are broad. These requirements are ideally matched to the power electronic building block (PEBB) concept, in which complex power conversion architectures are constructed from standardized and highly optimized building blocks. The PEBB concept originates from applications in which reliability and rapid return to service are of paramount importance.

There are advantages behind the PEBB concept in SSPS applications including that standardized building blocks act as a unit of functional abstraction, decoupling the construction of complex utility-scale systems from device and circuit-level considerations. Successful precedent can be found at smaller scales of electrical system integration. Standardized integrated circuit components enable electronics engineers to construct complex functional systems without prerequisite understanding of physical processes within the component. In the same way, a standardized building block framework enables power system engineers to develop solutions to system-level challenges with reduced engineering effort.

Key among the PEBB concept's attractive attributes is the ability to replace individual modules without system-level redesign. A failed module can simply be replaced, enabling an immediate return to service for the system. Since the same standard modules are used to construct systems for a great variety of applications, a small local stock of modules would support repair operations for many different systems in a single service area.

In theory, the replacement module serves the same role as the module it replaces. In practice, though, it is unlikely that an unused replacement module will be identically matched to modules which have been in continuous operation. This implies some level of robustness to inhomogeneities between modules. However, little consideration has been given to the impact of module inhomogeneities on system-level performance, particularly when differences between modules go beyond the effects of normal degradation over time. The level of module inhomogeneity supported at the system level has significant implications for the PEBB concept and is directly tied to the notion of module standardization. Again, drawing a parallel to standardized electronic components, a circuit designer may identify and source equivalent parts from multiple manufacturers, reducing susceptibility to supply chain disruptions. Criteria for acceptability of the replacement depend on the application, but in general, more flexible criteria lessen the likelihood of costly redesign due to part obsolescence or inadequate supply.

It is clear that the degree of uniformity required between modules is central to the practical success of the PEBB concept in SSPS applications. If standardization requirements are too restrictive, there will be no room for innovation in module composition. On the other hand, if standardization is too loose, the system controller must accommodate (and compensate for) differences between modules. If the ability to support modules with significant differences increases the amount of information which must be exchanged between the central controller and individual modules, the scalability of the modular framework is reduced.

The present disclosure is directed to modular solid-state transformers (SSTs). SSTs are a subset of the SSPS concept which serve the specific function of controlling the exchange of power between two AC power systems. Of all power conversion functions an SSPS may provide, AC-AC power conversion is perhaps the most challenging with respect to modular implementation. Voltage scalability is a central challenge for all modular power conversion systems and requires careful management of how system-level voltages are balanced among cascaded (series-connected) converter modules. In DC systems, managing this voltage balancing may be accomplished by controlling voltage magnitudes. In AC systems, both magnitude and phase angle must be controlled. The AC-AC conversion case was chosen for this study specifically because of this complexity. Lessons learned from control analysis of a modular AC-AC system will directly apply to modular AC-DC and DC-DC applications.

Functionality and Control of SST

At its most basic level, the transformer has one primary job in the electric power system: to as faithfully as possible convert one voltage to another voltage. While electromagnetic transformers, in general, may have other benefits in the power system (e.g., providing galvanic isolation, zero sequence fault current, and others), their primary purpose is voltage conversion. Similarly, while SSTs may have a host of possible benefits (system asynchronization, independent P/Q behavior, etc.) that enables them to transform the future power system, their most basic functionality is to convert one voltage level to another.

Since a traditional electromagnetic transformer is a passive device, the transformer will simply mirror the resource behavior on one side of the device onto the opposing side. For example, for a distribution transformer that has only load on the secondary side, the source on the primary side will see the secondary-side loads reflected across the transformer, and thus the source sees the transformer as a load. Conversely, the load on the secondary side will see the transformer as a voltage source since it is reflecting the voltage sources from the primary side. If there are voltage sources on the secondary side of the transformer, then the transformer will operate as a voltage source, as seen from the primary side.

Since an SST is a controlled device, a wider range of operating states are possible. The SST can operate as a voltage source or current source/load regardless of the type of asset it is connected to. In general, a current source device can be modelled as a negative load To determine how an SST should operate in the power system, it is necessary to understand the different cases of SST implementation.

There are four basic cases, as shown in FIG. 1. An SST transforms the voltage between a high voltage primary side (left) and a lower voltage secondary side (right). It is assumed, as a simplification, that the primary side will aways be connected to a rather stiff voltage source (this is a reasonable approximation for the current power system, although this may change for future power systems) and only consider different states on the secondary side of the SST.

The first two cases of SST operation involve only load on the secondary side of the SST, regardless of the direction of power transfer. This load can be presented by either a positive load (i.e., a conventional load) or a negative load (i.e., a generation device operating in grid following (GFL) or current source mode). The last two cases are similar but have a mixture of load (positive and negative) as well as voltage sources (i.e., generation devices operating in grid forming (GFM) or voltage source mode).

For the first two cases, where only load is present on the secondary side, it is obvious that the SST must have GFM control on the secondary side to act as the independent voltage source in the system. Without the SST operating in GFM, there would be no voltage source on the secondary side of the transformer and the system would be unstable. For the second two cases, the SST can operate in either a GFM or a GFL mode due to the presence of the voltage source on the secondary side. However, operating in a GFM mode would allow for the SST to reflect certain beneficial properties of the primary side, such as high "inertia" in frequency (low df/dP), where df/dP is the change of frequency with respect to power, onto the secondary side. This should improve stability on the secondary side, especially under dynamic conditions due to load or generation variability.

In all cases, an SST without significant energy storage must reflect active power flow demands of the secondary side over to the primary side. Assuming that there are other voltage sources on the primary side of the SST, the primary-side interface is free to operate in either a GFM or GFL control mode. For the last two scenarios in FIG. 1, the voltage source behavior on the secondary side is generally advantageous to reflect to the primary side, so that the GFM benefits can be transferred to the larger power system (this would be required for power systems which have all generation resources fully interfaced with SSTs). In the first two scenarios, where only load is present on secondary side, the SST's primary-side stage is free to operate in either a GFL or a GFM mode. To emulate a traditional transformer, the SST would operate in a GFL mode and be seen as a load on the primary side. However, this could require a mode switch between GFM and GFL if, for example, an intermittent voltage source is present on the secondary side (moving from scenario 1 to scenario 3 or 4). This mode switch can be difficult to implement and result in instabilities. Therefore, the most general system-level control approach is to operate the SST in GFM mode on both primary and secondary sides. Based on breadth of functionality and absence of problematic mode transitions, full GFM operation at primary and secondary must be considered the ideal case for system-level control.

Multi-Module Operation

Multi-module SSTs can have several different topologies depending on the voltage/current level of the system compared to the voltage/current level of the individual modules. As modules can be connected in either series or parallel on the input/output, this indicates that there are four possible topologies (FIGS. 2A-2D). As the SST is a bidirectional device, and the Input Series-Output Parallel (ISOP) and Input Parallel-Output Series (IPOS) (b and c) are equivalent for a bidirectional device, there are three distinct configurations for the SST: IPOP, IPOS/ISOP, and ISOS.

The wiring topology of different modules determines the relationship between current and voltage between modules. For series-connected modules, the voltage drops across all the modules sum to the total system voltage and the current through all the modules is determined by the lowest current handling unit. Alternatively, for parallel-connected devices, the voltage across each module is the same while the current sourcing/sinking capabilities of each module are independent.

This implies that for parallel-connected modules, the goal for control schemes should be current sharing while for series-connected devices, the goal should be voltage sharing. A summary of this is shown in Table 1. If all modules in an SST are equal, then the voltage/current sharing should be equitable among all modules, as described by Equations (1) and (2).

TABLE 1

| Con-figuration | Input Side | | Output Side | |
| --- | --- | --- | --- | --- |
| | Input Voltage | Input Current | Output Voltage | Output Voltage |
| IPOP | Equal by Connection | Equal sharing achievable by control | Equal by Connection | Equal sharing achievable by control |
| IPOS | | | Equal sharing achievable by control | Equal by Connection |
| ISOP | Equal sharing achievable by control | Equal by Connection | Equal by Connection | Equal sharing achievable by control |
| ISOS | | | Equal sharing achievable by control | Equal by Connection |

Relationship between the input and output side.

For current sharing (parallel operation) with a system of N modules:

$$I_{module} = \frac{I_{system}}{N} \quad V_{module} = V_{system} \tag{1}$$

For voltage sharing (series operation) with a system of N modules:

$$V_{module} = \frac{V_{system}}{N} \quad I_{module} = I_{system} \tag{2}$$

where $I_{module}$ is the current through the module, $I_{system}$ is the total system current, N is the number of modules, $V_{module}$ is the module voltage, and $V_{system}$ is the total system voltage.

Figure 3:
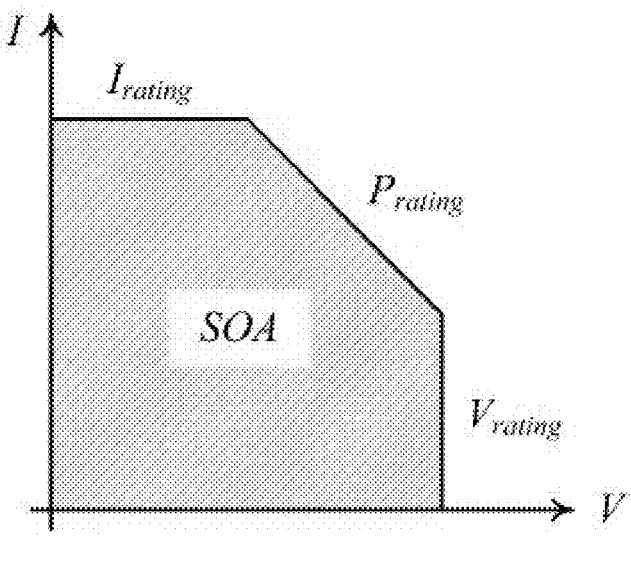
FIG. 3 shows an exemplary SOA of a proposed SST module according to an embodiment of the disclosure.

For multi-module systems with identical modules, each module can be controlled with the same voltage and current setpoints. However, for hybrid module systems, it is expected that modules will have different Safe Operating Areas (SOA) that incorporate different maximum ratings for current, voltage, and power for that specific module (FIG. 3). In this case, for modules with different ratings, we no longer desire completely equitable voltage/current sharing as described in Equations (1) and (2), but rather voltage and current capacity sharing. This means that the per unitized values of current and/or voltage are equal among modules (Voltage or current normalized to the module's voltage/current rating). Namely, rather than the absolute voltages/currents being equal among modules, the ratios of the voltages and currents to the module rating should be equal.

In this case, for hybrid module operation and current sharing (parallel operation) with a system of N modules:

$$\frac{I_{module}^i}{I_{rated}^i} = C \quad \text{and} \quad C \cdot \sum_{i=1}^{N} I_{rated}^i = I_{system} \quad V_{module}^i = V_{system} \tag{3}$$

For voltage sharing (series operation) in a hybrid system of N modules:

$$\frac{V_{module}^i}{V_{rated}^i} = R \quad \text{and} \quad R \cdot \sum_{i=1}^{N} V_{rated}^i = V_{system} \quad I_{module}^i = I_{system} \tag{4}$$

where C and R are constants, $$I_{module}^i$$

is the current through the $i^{th}$ module, $$I_{rated}^i$$

is the current rating of the $i^{th}$ module, $$V_{module}^i$$

is the voltage across the $i^{th}$ module, and $$V_{rated}^i$$

is the voltage rating of the $i^{th}$ module.

The voltage and current of any module must be within its SOA, and any module can limit system voltage (in parallel operation) or current (in series operation). This implies that in parallel operation, the system voltage has a maximum voltage of the lowest voltage rating of all the modules.

$$\min(V_{rated}^i) \geq V_{system} \tag{5}$$

In series operation, the system current has a maximum of the lowest current rating of all the modules.

$$\min(I_{rated}^i) \geq I_{system} \tag{6}$$

The fact that parallel voltage or series current is limited by the rating of the lowest module means that replacement or upgrading of certain modules will not significantly affect system operation. As an example, for parallel-connected modules, where the system voltage is limited by the lowest voltage rating of the modules (see Equation (5)), replacing the highest voltage rated module with an even higher voltage rated module will not affect the overall system operation (since system voltage is limited by another module). Only in certain instances will replacing a module with a higher rating module affect overall system operation.

In general, for parallel-connected modules:
   i. Replacing any module with a higher $V_{rated}$ module will not alter system operation, unless the replaced module is the voltage limiting module
   ii. Replacing any module with a higher $I_{rated}$ module will increase system power as it can source greater current at the same percentage of capacity. This will slightly increase the amount of current sourced while maintaining the same capacity factor, C For series-connected modules:
   i. Replacing any module with a higher $I_{rated}$ module will not alter system operation, unless the replaced module is the current limiting module
   ii. Replacing any module with a higher $V_{rated}$ module will increase system power as it can source greater voltage at the same percentage of capacity. This will slightly increase the amount of voltage sourced while maintaining the same capacity factor,

R

Multi-Module Control

Figures 3, 4:
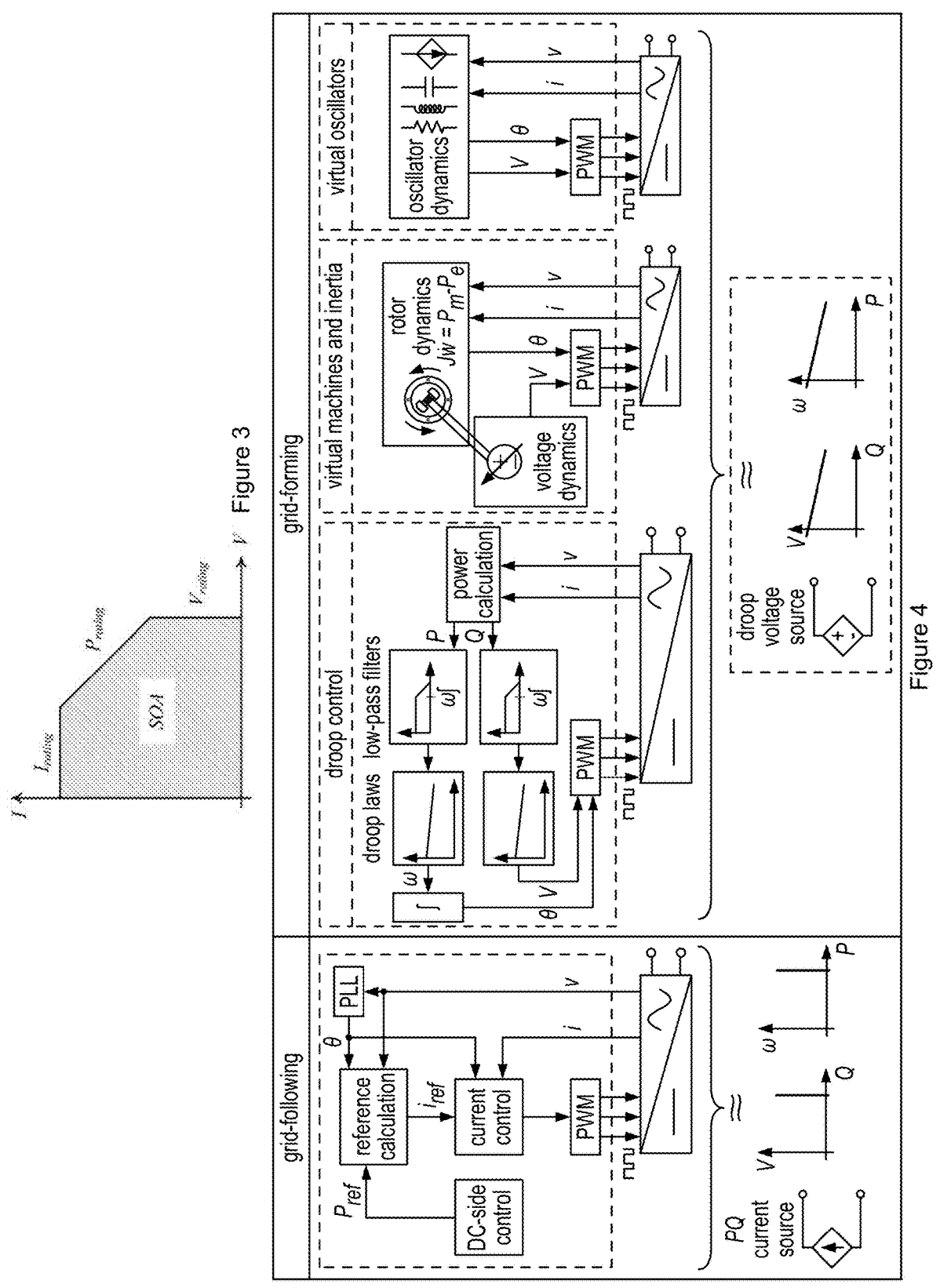
FIG. 4 shows a comparison between GFL control scheme (left) which control current output and GFM control (right) which controls voltage and phase angle.

For any series-connected module, Eq. (4) indicates that current flow through the module is not a freely controlled variable (it is dependent on the ratings of other modules). Conversely, voltage at the terminals of the module is a controllable variable. In general, there are two main control modes for power electronics (FIG. 4). The most common, historically, has been GFL behavior. In this control mechanism, a power electronic device uses an already present voltage signal to control P and Q injection. In this control scheme, the power electronic device does not exert closed-loop control over the voltage at its terminals. A second control scheme, GFM, allows the power electronic device to control phase angle and voltage at its terminals and will source P and Q necessary to supply the load.

For series-connected modules, both magnitude and phase angle of module terminal voltages must be controlled to enable voltage capacity sharing. Voltage control is necessary to balance voltage drop across each module. Phase angle control is necessary so that each module remains synchronized. Since no module has full electrical connection to the external system terminals, there is no way to intrinsically synchronize modules with the external grid. Modules operating at slightly different phase angles will tend to generate circulating reactive power. Although this does not affect the system sourcing or sinking of power (since the net P/Q across modules is zero), it reduces efficiency, increases heat dissipation, reduces headroom in the system, and can ultimately lead to system instability if phase angles substantially diverge. Since voltage and phase angle must be controlled at the terminals of each module, this means that GFM control is the only appropriate control mode for series connected modules.

For parallel-connected modules, either GFL or GFM control is appropriate since current flow is the controllable variable while voltage is uncontrollable. GFL control explicitly controls current injection, simplifying the implementation of current sharing behavior when an external voltage source is present to maintain voltage and frequency. On the other hand, GFM droop control will naturally capacity-share current between paralleled units and will function without an external grid source. Either control mode is possible, but one or the other may be preferred depending on system-level conditions.

Homogenous modular Solid State Transformer (SST) units allow for all levels of the control hierarchy to be accomplished within the same controller. For heterogeneous modules, this centralized approach becomes intractable not only because devices are different between modules (leading to differences in parasitic capacitance, resistance, transients, etc.), but whole circuit-level topologies may be different from module to module. In such a case, the hierarchical control architecture must be decentralized and split between some on-board module-level control and top-level system control. Disclosed herein is a hierarchical control system for an SST system composed of heterogenous modules that is split between the system-level control and the module-level control.

Information Flow Between System and Modules

SST systems must manage a variety of power electronics technologies, power levels, and time scales ranging from single devices to full systems. As the control mechanisms from the system level (~ms) to the switch level (~ns) can span many orders of magnitude, the disclosed invention uses hierarchical control methods to address the variation of power electronics technologies.

Figure 5:
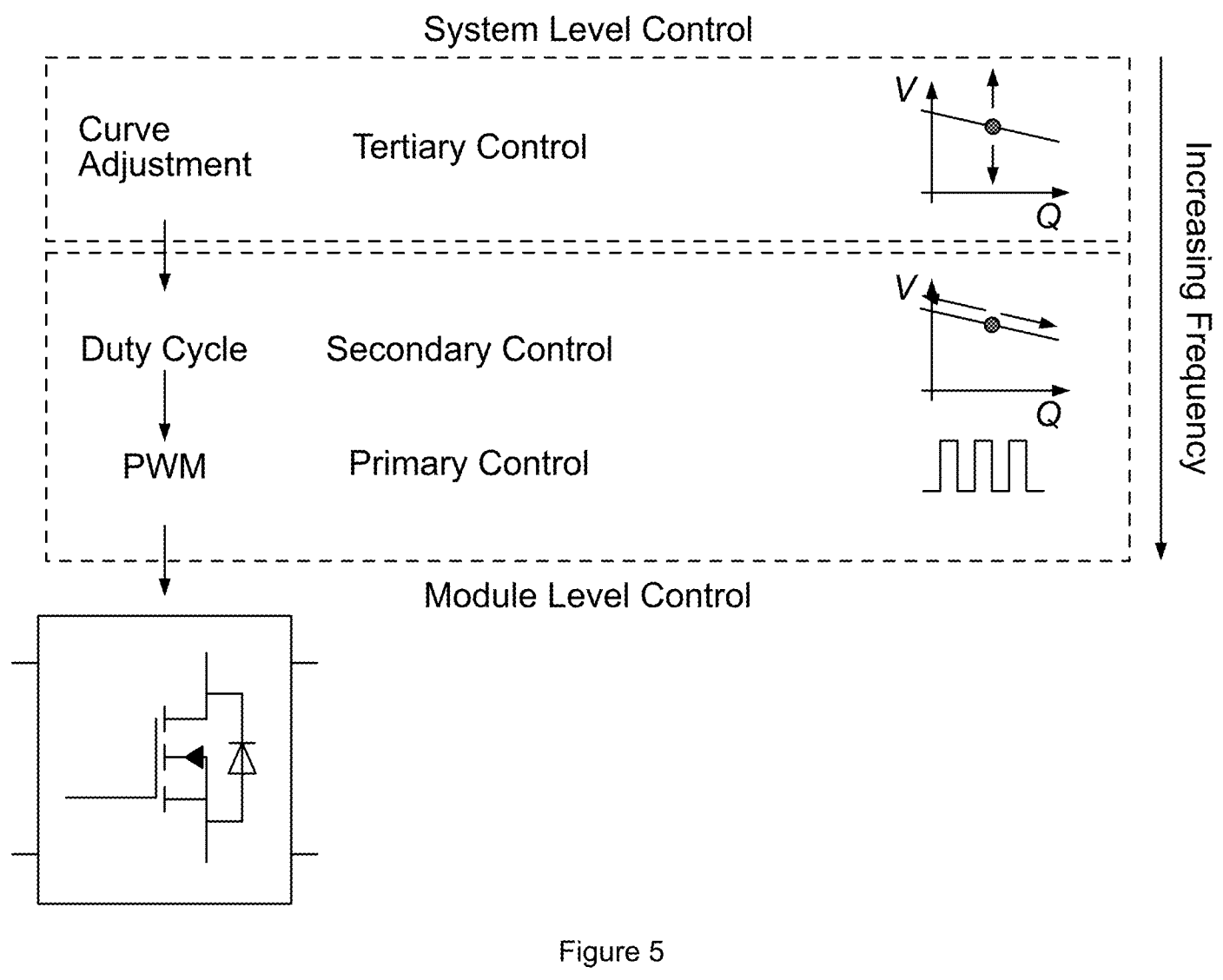

Hierarchical control schemes typically split control mechanisms based on time of response (see FIG. 5). At the fastest level of control is the signal required to actuate semiconductor devices, typically something like a gate drive signal. This gate drive signal can be controlled using many mechanisms (e.g., pulsed width modulation or PWM), but typically operates with bandwidth in the GHz regime. The generation these signals is often referred to as primary control. The terms primary and secondary, used here in context of the control hierarchy, should not be confused with the terms primary-side and secondary-side, which refer to the opposing terminals of the SST. Primary-side control refers to the entire control system in application at the high voltage AC terminal of the SST, which incorporates mechanisms at primary, secondary, and tertiary control layers. At a hierarchical level above this is alteration of transient device setpoints based on some autonomous governing equation. In this secondary control layer, switching setpoints are changed according to some internal autonomous control scheme (e.g., a droop curve) based on locally measured external variables (e.g., terminal voltage) with bandwidth in the MHz regime. Finally, at the top level is the adjustment of the properties of the autonomous control scheme based on system level needs (e.g., shifting droop curve). This highest hierarchical level, or tertiary control, has a bandwidth more amenable to system-level dynamics, on the order of kHz.

Referring again to FIG. 5, the example of a hierarchical control scheme shows a conceptual diagram showing the nature of this hierarchical control for heterogenous modular systems. The hierarchical control is broken down into time frame with slower time processes on top and faster time processes on the bottom. Fast time control that is hardware specific (enclosed by the black dashed box) are carried out locally at each module. Slower time response behavior is carried out by a centralized controller (denoted by the red dashed box). This allows for slow communications between the central controller and individual modules as well as flexibility of switching schema for different modules with different topologies in a common system.

As discussed above, for homogenous modular SST units, all levels of the hierarchy can relatively easily be accomplished within the same controller. In fact, there are many advantages to having such a centralized control architecture. For example, since all modules in a homogenous SST unit are identical (in topology, component composition, etc.), it is possible to run all the modules from the same primary control signal (typically known as controller/target or master/slave). If differences in signal path length (and thus parasitics) are tightly controlled, then all the modules will operate identically, in phase and naturally sharing voltage/current as needed.

This type of centralized control requires strict homogeneity between modules as well as rigid control of the communications pathways between modules. Changes in either of these (even due to changes in device parameters due to, for example, natural degradation during usage) can result in de-phasing of modules and eventual instability. For heterogeneous modules, this centralized approach becomes intractable not only because devices are different between modules (leading to differences in parasitic capacitance, resistance, transients, etc.), but whole circuit-level topologies may be different from module to module. In such a case, the hierarchical control architecture must be decentralized and split between some on-board module-level control and top-level system control.

In this distributed control regime, the different hierarchical levels of control must be split between the local module-level control and the centralized system-level control. It is assumed that the module-level control has access to all local variables for that module (voltage/current at terminals, etc.) while the system-level control has access to all system-level variables (voltage/current at the system level, interconnect phase angle, etc.). Furthermore, it is assumed that the system-level controller has some basic knowledge of each module, including nameplate voltage/current ratings and location in the system structure.

In such a hybrid system, primary control of each module must remain at the local module level for two reasons. The first is that the specifics of primary control are highly dependent on the components and circuit topology used. Enumerating all information requirements for primary control generation (including number of signals, voltage level, dead-time, frequency, etc.) is intractable for a large population of possible configurations. Secondary control, from which a specific primary control can be derived, can be located either at the system-level or module-level. However, as secondary control is intimately tied to the specific control scheme of a module (e.g., droop-based vs. virtual oscillator), housing secondary control at the system level would unnecessarily constrain the types of control schemes allowable at the module level. The tertiary level, which is adjustment (via either incrementation or setpoint determination) of the intrinsic control scheme based on system-level response, should lie with the system-level controller. This adjustment of individual control schemes is based on system-level measurements and only requires slow iteration of dynamic setpoints.

In inverter-based generation systems, secondary control mimics how paralleled generation operates in the electrical grid. Each generator operates with droop-like behavior in regard to target system frequency and local voltage (i.e., a drop in frequency/voltage triggers an increase in the injection of real/reactive power). These generators will share load and converter capacity and reach steady state at a given frequency. However, this steady-state frequency may not necessarily be the desired frequency (i.e., 60 Hz). Therefore, a higher-level controller is used to increment and decrement the setpoints of the generators (or group of generators) in order to achieve the absolute setpoint. This hierarchical structure is similar to the differentiation between system-level control and module-level control in the proposed hybrid multi-module system. Each individual module should be able to stably control its output behavior. The system-level controller can then fine-tune individual or aggregate module behavior in order to achieve the desired system output.

A simple version of this inverter control arrangement would apply for a parallel connection of SST modules. Upon initialization, the system-level control knows how many modules are present, their ratings, and any other relevant information. The system-level control sends a target parameter to the module (this can be current or power). The module-level control works to achieve this setpoint. Based on system-level response and need, the system-level control can iterate this setpoint to achieve the desired system state. For modules that are wired in parallel, this case is simple since each module has information on the system-level output voltage (and therefore system output phase). For cascaded modules, the case is more complicated since individual modules have no knowledge of system output voltage. To enable modules to self-coordinate cascaded output behavior, two pieces of information must be provided by the system-level controller. The first is an appropriate voltage setpoint (this can be a per-unitized voltage or an absolute voltage). In contrast to the paralleled case, the voltage magnitude alone is not enough: individual cascaded modules have no locally available information on system-level phase angle, and must be provided a global synchronization reference. Without synchronization between the modules' voltage phase angles and system-level phase angle, reactive power will flow between modules in the SST. The synchronization reference may be an externally-derived phase angle, such as from an external grid voltage, or an arbitrary angle generated internally to support islanded mode operation.

Module Types

Figure 6:
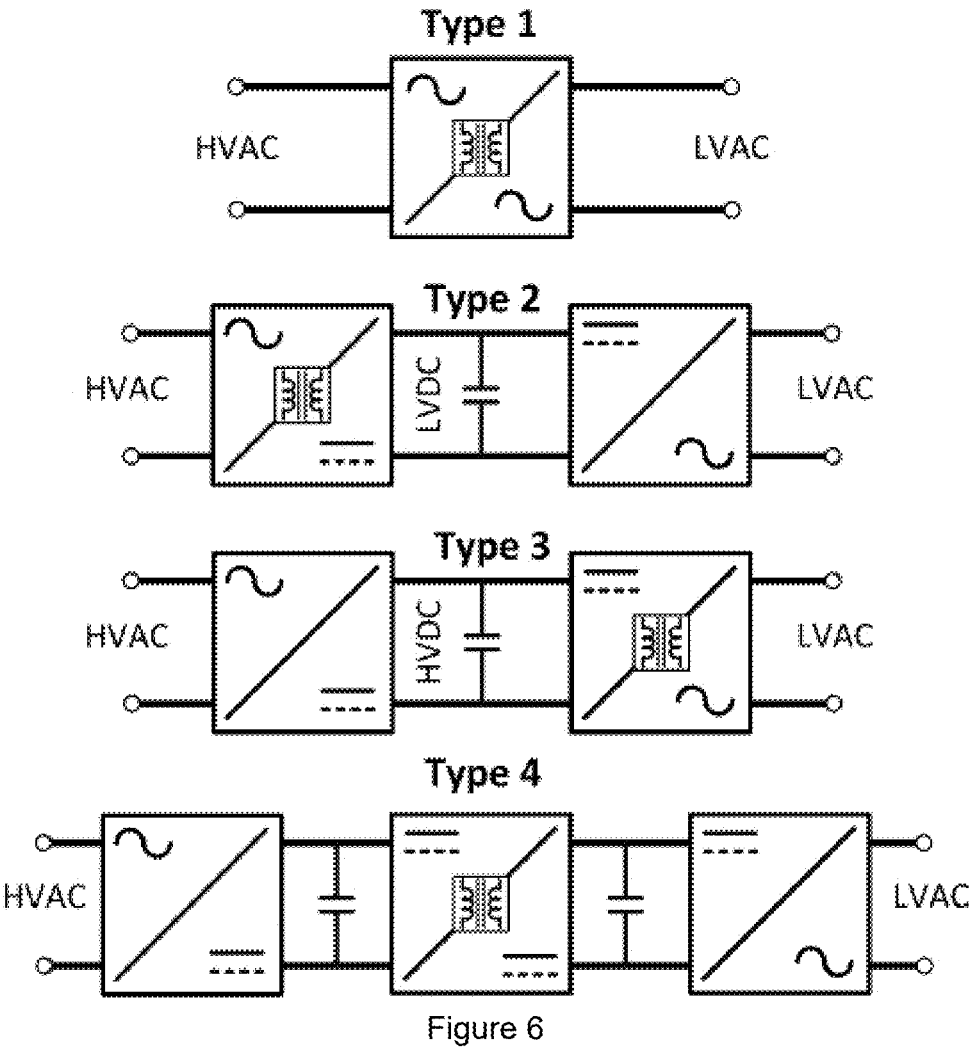
FIG. 6 shows types of AC-AC power conversion module

Previous studies have analyzed and categorized AC-AC power converter module topologies at length. In one approach, the AC-AC power conversion modules may be categorized into four "types." A diagram of these types is shown in FIG. 6. A type 1 module is a direct, or single-stage, AC-AC converter. In a type 1 module galvanic isolation, power flow control, and voltage scaling are accomplished in a single stage. Type 2 and type 3 modules involve two power conversion stages. In type 2 modules, voltage scaling and galvanic isolation are achieved in the primary, or high voltage, AC interface converter. In type 3 modules, voltage scaling and galvanic isolation occurs in the low voltage AC interface converter. The location of the voltage scaling functionality influences the voltage of the DC link connecting the back-to-back converters. The DC link voltage magnitude is linked to the voltage of the grid to which the module connects without isolation. Consequently, type 2 modules feature a low voltage DC link, while type 3 modules have a high voltage DC link. Type 4 modules have three power conversion stages: two grid-facing DC-AC stages joined by an isolated DC-DC converter.

Schematically, type 1 modules have the lowest complexity and smallest component count. These features are desirable from an efficiency and reliability standpoint. However, there are several challenges for type 1 modules that have hindered their development. The biggest obstacle for type 1 modules is their dependence on a 4-quadrant semiconductor switch. Fast-switching devices capable of 4-quadrant operation are not commercially available. As a result, these switching elements are typically implemented using a combination of two discrete devices. Coordinating the switching behavior of the two devices requires precise timing and increases the complexity of the converter's gate driver circuitry. The second challenge for type 1 modules is the lack of stored energy in the converter. All other module types include a DC link with capacitive energy storage. This DC storage decouples instantaneous input and output power waveforms. Without storage to provide this decoupling effect, the active and reactive power sourcing/sinking capabilities of type 1 modules is limited. Moreover, these limitations change depending on the phase angle difference between primary and secondary-side voltage waveforms.

Type 2 and type 3 modules are simpler to control due to the presence of a DC link. The DC link also allows type 2 and type 3 modules to provide reactive power support and decouples voltage waveforms on the primary and secondary side, simplifying interconnection of asynchronous grids. However, both type 2 and type 3 modules require bidirectional switching devices in the isolated DC-AC stage.

Type 4 modules are the most schematically complex, but easiest to control due to the multiple DC links decoupling the three power conversion stages. Type 4 module designs are the most prolific in existing literature. This is almost certainly due to the significant operational flexibility enabled by the decoupling of power conversion stages. Decoupled operation allows a circuit designer to focus optimization efforts on the isolated DC-DC stage. A wide variety of isolated DC-DC converters with desirable performance characteristics (high efficiency, voltage gain, power density, etc.) have been proposed for this purpose, and it remains an active area of research. Type 4 modules have been more thoroughly demonstrated in practical applications as well, including in use as a 1 MVA solid state power substation for naval vessels.

An additional type, or perhaps subtype, of AC-AC module uses an isolated DC-DC converter between two AC-DC conversion stages but does not maintain a constant DC link voltage at either side of the DC-DC converter. The voltages present at these quasi-DC links is strictly positive and periodic at twice the line frequency. The AC-DC stages switch only at the line frequency to invert the quasi-DC link voltage, transforming it into a full sinusoidal waveform. Reducing the switching frequency of these "unfolding bridges" decreases switching loss and enables the use of higher voltage switches without the disadvantage of increased filtering requirements.

Semiconductor Technology Development

Semiconductor power devices are the underpinning of next generation SSTs and SSPS. Higher power and higher efficiency solid-state switches enable new applications and are key to the success of many of the circuit topologies mentioned so far. Present silicon switching devices have reached the peak of their development. High voltage (6.5 kV) silicon devices suitable for medium voltage converters such as the insulated gate bipolar transistor (IGBT) and integrated gate commutated thyristor have a practical operating frequency of a few hundred hertz making the system quite bulky. Compared to silicon, the wide bandgap (WBG) semiconductor silicon carbide (SiC) offers a ten-fold improvement in breakdown electric field which translates directly to an improvement in on-state performance, switching performance, and breakdown voltage. Commercial SiC MOSFETs are rated up to 3.3 kV and can operate at 10s of kHz frequencies in medium voltage converters. SiC MOSFETs and IGBTs have been demonstrated up to 15 kV, and a systematic study reports a trade-off between these devices finding that MOSFETs are the best choice for high frequency applications (>2 kHz) when the voltage is <10-15 kV whereas IGBTs are the superior choice for higher current applications at low frequency. However, to-date there have not been any commercial high voltage (>1.2 kV) SiC IGBTs. More than ten years ago the outlook for SiC was that IGBTs and gate turn-off thyristors (GTOs) where the future for high current high voltage applications yet SiC MOSFETs remain the champion today.

Although there are many differences between these three device types, a key difference worth highlighting is the operational switching frequency where each technology performs best. High power MOSFETs are well suited for ~20 kHz switching applications, IGBTs are better suited for ~2 kHz, and GTOs for 200 Hz. Considering this, does the application of future medium voltage conversion demand the switching frequency advantage MOSFETs can bring? High switching frequency enables a reduction in volume for passives and quick system response to transients for better control. What impact does switching frequency have on the future of SST/SSPS technology and where is the threshold in frequency that provides an enabling benefit?

Beyond traditional switching devices, there is renewed interest for development of bidirectional switches which would be a key enabler for current-source inverters. Topologies enabled by the bidirectional switch can greatly reduce cost and improve reliability by reducing the total number of switches and eliminating the need for bulky electrolytic DC link capacitors, a major concern for long-term reliability. Historically, several varieties of bidirectional switches have been proposed, some bidirectional switch schemes consist of as many as five discrete devices per leg with on-state voltage drops as high as 3.5 V. This high quantity of devices and high on-state voltage drop per switch leg is prohibitive for both cost and performance. A bidirectional field effect transistor (BIDFET) in a R&D environment rated for 1.2 kV and 20A operation comprised of two JBSFETs (Junction Barrier Schottky Field Effect Transistor) in a common-drain configuration has recently been demonstrated. In this configuration these two devices can be monolithically integrated on a single die and have a low on-state voltage drop of 0.5 V. An additional advantage of the bidirectional switch topology is that the low voltage output and reverse-transfer capacitances (Coss and CRSS) are reduced by half compared to a discrete solution. This directly translates to improved switching performance for the BiDFET which further serves to minimize the volume for the magnetics and increase power density of the entire solution.

Figure 7:
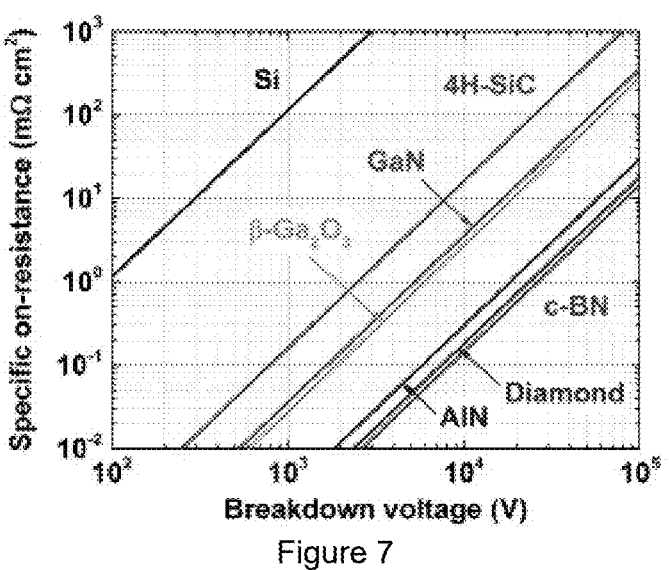
FIG. 7 shows the Baliga figure-of-merit for various conventional, wide bandgap, and ultra-wide bandgap semiconductors.

In addition to the BiDFET, device technology such as super-junction WBG devices and ultra-wide bandgap devices (UWBG) would also be considered enabling for SST/SSPS technology by bringing further improvements in system power density and efficiency. UWBG devices can provide breakdown field strengths from 5-10 MV/cm and promise a significant performance advantage even compared to SiC (FIG. 7), although presently these devices are at a very low level of maturity. Super-junction (SJ) devices enable pushing past the unipolar figure of merit by not only leveraging conductivity modulation through bipolar carrier transport, but also providing a uniform distribution of electric field through the drift region leading to a significant improvement in on-resistance. Recent work on SiC-SJ-MOSFETs demonstrate that the on-resistance at high temperatures (175° C.) can be lowered by more than half compared to a conventional non-SJ MOSFET. The super junction structure can provide a more near-term solution compared to UWBG devices and both are interesting paths forward to enable the next generation of SST/SSPS technology.

Finally, special consideration should be given for what new limitations will be encountered when designing with the future generations of semiconductors with high voltage ratings and higher switching speeds. For example, at this moment there are not many choices of medium voltage capacitors that are suitable for 10 kV device-based systems. Shrinking the volume of capacitors in multi-level converters is a key issue as the capacitor volume can be many times the volume of the power module and heatsink combined. Additionally, with higher voltage devices and fast switching transitions will dV/dt become an issue for gate drive designs, EMI filter designs, and insulation? To maintain the same switching frequency for higher voltage devices it may be necessary to push the switching transition harder, resulting in higher changed in Voltage/changes in time (dV/dt) switch events.

SIMULATION STUDIES, System Implementation

Overview

To determine information flow and control requirements for a practical SST system, a set of Matlab/Simulink simulations were generated. The simulations are all variations on an initial base system. The base simulation depicts a single-phase 2400V/277V SST consisting of six identical type 4 modules. Each module has a base power capacity of 60kVA for a total system-level capacity of 360k VA.

The simulations have three components: a circuit simulation implemented in PLECS, a set of independent module controllers, and a central system controller responsible for high-level operations. Module controllers contain primary and secondary control functions. The system controller performs tertiary control functions. Module and system control structures were developed over the course of the project based on the analysis presented in Section 2 and lessons learned during the construction of the simulation models. The development and demonstration of these control structures is one of the most significant outcomes of the project.

Simulation results presented in this section depict transient dynamics for three important system-level operations: islanded mode black-start, grid synchronization, and response to a change in primary-side frequency. Responses during these operations provide a cross-section of the system's dynamics and ability to maintain stability through a variety of operating states. The final step, in which the system responds to a change in grid frequency, is used to demonstrate bidirectional power flow capabilities. To simplify comparison between scenarios, the same set of operations is shown for all cases.

Note that islanded operation is shown at the system's primary side, but not at the secondary side. This is because control of secondary-side operation is conceptually identical to control of parallel grid-forming inverters. The same distributed control methodologies applied to parallel inverter systems can trivially be applied to secondary-side operations. In contrast, control over primary-side operations is not nearly as well explored in existing literature and is critical to the success of a modular SST implementation. Consequently, simulation studies presented here focus mainly on primary side operations and control.

Power Conversion Hardware

Figures 8, 9:
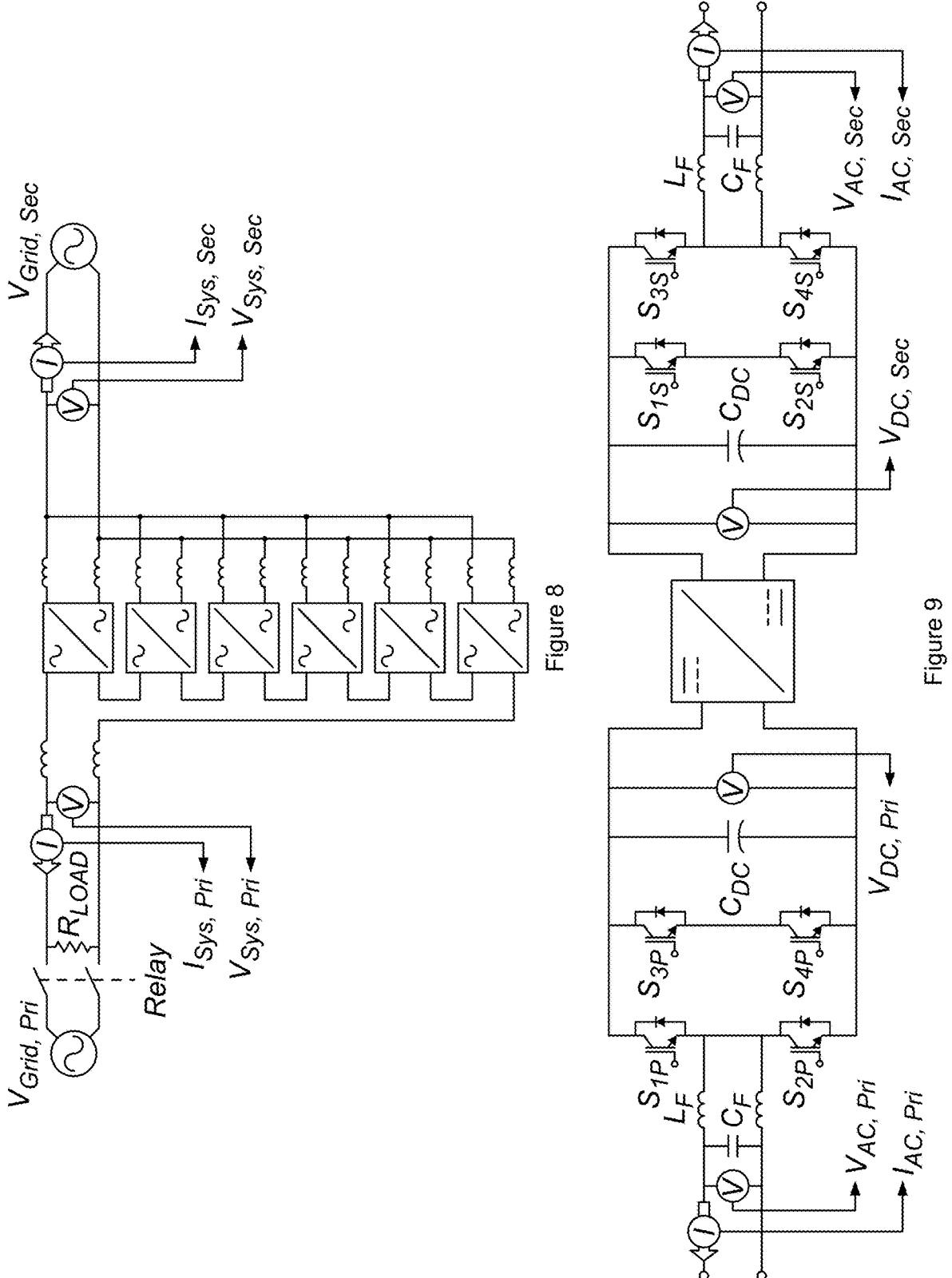
FIG. 8 shows a system-level schematic diagram according to an embodiment of the invention.
FIG. 9 shows an individual module schematic diagram according to an embodiment of the invention.

Power conversion circuits implemented in the PLECS hardware block are shown in FIG. 8 and FIG. 9. FIG. 8 shows the system-level schematic, which includes six modules of type 4 connected in an ISOP configuration. At the primary side, the cascaded modules connect to a 2400V single-phase grid through a coupling inductance. At the secondary, modules connect in parallel to a 277V single-phase grid. Sensors monitor primary and secondary voltages and currents in the positions indicated in the figure.

FIG. 9 shows a module schematic. Each module contains a single-phase inverter/rectifier pair with isolated DC-DC converter connecting their DC links. The inverter and rectifier implemented using a standard H-bridge topology. Semiconductors are all modeled as MOSFETs with antiparallel diodes. AC ports of the rectifier and inverter circuits interface to the external system through LC filter elements. The DC-DC converter provides the necessary galvanic isolation between the two AC ports. Without this isolation, it would not be possible to implement the modular ISOP structure. For this reason, the DC links of the inverter/rectifier pair cannot be connected directly together, even as a simplification to reduce the computational complexity of the simulation. On the other hand, implementing the full switching behavior of an isolated DC-DC converter significantly increases the complexity of the simulation and leads to intolerable execution times. The most common topology used for this isolated DC-DC conversion application is the DAB converter, which contains 8 MOSFET devices. This effectively doubles the number of semiconductors contained in the module. Additionally, the switching frequency of DAB converters in this application is much higher than that of the rectifier/inverter H-bridge circuits. The maximum simulation time-step is limited by the duration between any two switching events occurring within the PLECS circuit. So as the number of switching devices and frequency of switching events increases, so too does number of computations required per unit of simulation time. This is a major obstacle to system-level analysis.

To maintain tractability, the DC-DC converters are modeled using idealized behavior. This corresponds to a modeling assumption that the switching frequency and control bandwidth of the DC-DC converters is much faster than that of the inverter/rectifier H-bridge circuits. Luckily, this condition is easily met in practice due to the high switching frequencies employed in isolated DC-DC converter circuits. The idealized model provides the galvanic isolation required for the SST simulation and maintains conservation of power between the inverter and rectifier circuit DC links.

Each module's hardware contains local sensing capabilities. Voltages and currents sensed at the module-level are shown in FIG. 9. These include AC voltages and currents and primary and secondary ports and voltages across each DC link terminals.

In the base simulation, all modules have identical parameter values. A table of these parameters is shown as Table 2.

TABLE 2

| Base module hardware and control parameters. | | |
|---|---|---|
| Parameter | Primary-Side Value | Secondary-Side Value |
| Rated Power | 60 kVA | 60 kVA |
| Nominal DC Link Voltage | 750 V | 750 V |
| Nominal AC Voltage | 400 V | 277 V |
| AC Filter Capacitance | 100 μF | 100 μF |
| AC Filter Inductance | 800 μH | 1000 μH |
| DC Link Capacitance | 800 μF | 1200 μF |
| Switching Frequency | 5 kHz | 5 kHz |

Control Implementation

Control of the system is accomplished using a hierarchical structure. The system-level controller is responsible for managing system power demand and appropriately partitioning voltages and currents amongst the individual modules. In an ISOP configuration, the more challenging control tasks exist at the primary side, where module voltage balance requires knowledge of a common phase reference, which is not locally accessible to the individual modules. On the secondary side, each individual module has the option to use voltages sensed at AC terminals to achieve global synchronization. This statement assumes that secondary side AC terminals are exclusively connected in parallel. If the secondary side is not strictly combined in parallel, i.e. if any number of modules are cascaded on the secondary side, the secondary side will require a global synchronization signal in the same way as the primary. The same is true of voltage reference set points. This is not possible at the primary side and must therefore be facilitated by the system-level controller. In addition to the phase synchronization signal, the system controller must provide low-speed setpoints for primary-side module voltage magnitudes and incremental adjustments to the droop curves implemented by module-level controllers.

Figure 10:
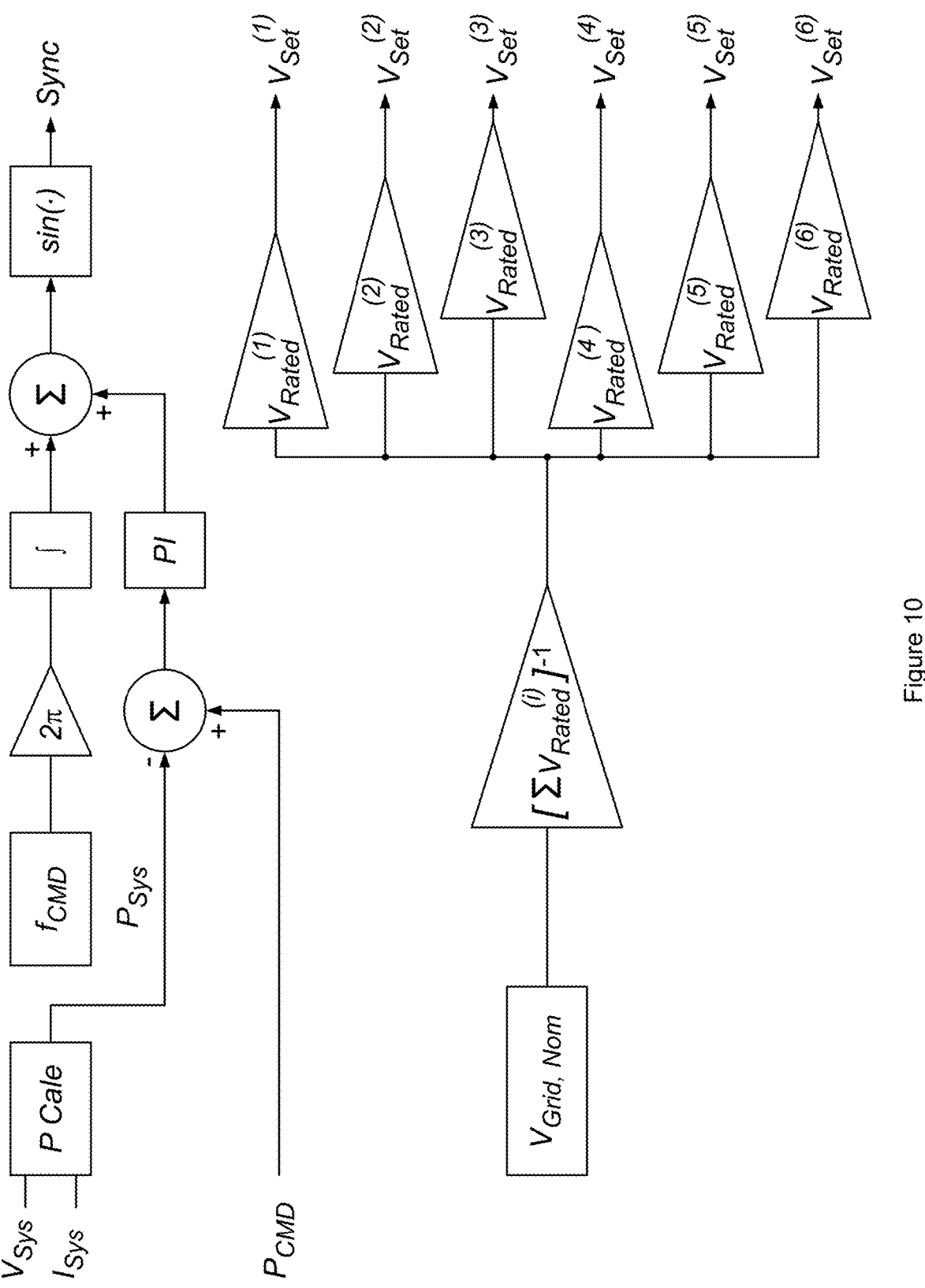
FIG. 10 shows a system controller block diagram according to an embodiment of the invention.

A block diagram of the system controller is shown in FIG. 10. Inputs to the system controller are primary and secondary voltages and currents. In addition to these time-varying inputs, the system controller holds a set of static parameters representing the number of modules and their respective SOAs. A final optional input is available for exogenous control sources, such as operator commands. While the SST is fully functional as an autonomous system, it may be useful in some cases to manually control the amount of power exchanged between primary and secondary grids.

The primary-side voltage synchronization function is the most important information flow requirement for the modular system. It is also the only time-varying output generated by the system controller which requires some specific communication bandwidth. The synchronization signal is a line-frequency sinusoid which matches the phase and frequency of either the primary-side grid voltage or some internal reference generated by the system controller. An internal reference is necessary in cases where no primary side grid is present, such as islanded operation. In cases where a local grid voltage exists, the frequency reference may be the set by the output of a phase-locked loop (PLL) tracking the phase and frequency of the local grid waveform.

The synchronization signal also provides a mechanism for controlling system-level power according to external commands. This is accomplished by increasing or decreasing the reference phase angle sent to the modules in response to power commands. This function effectively bypasses the droop curves implemented in individual modules and switches the system into a GFL mode of operation. In this mode, system-level dynamic response is much faster, which may be advantageous when fast ramp rates are required by the application. However, the same increase in power may be achieved more slowly though droop curve adjustments, without the disadvantage of sacrificing GFM control.

The synchronization signal is sent unidirectionally, and identically, to all modules. It is therefore possible to transmit the signal with low-speed broadcast communication. The signal does not change as a function of the number of modules contained in the system, so it does not affect system scalability. Similarly, the voltage magnitude set points delivered to each module require only unidirectional information transfer. These, too, could be delivered through broadcast from the system controller, provided that each module be able to identify its own setpoint command using e.g. a unique module identification number or communications index. The rate at which these setpoints must be received is very low; in all simulations these voltage setpoints are static parameters determined purely from the modules' nominal AC voltage ranges.

Active and reactive power are calculated from voltage and current measurements and provided as input to a set of droop equations. The droop equations generate frequency and voltage magnitude terms, respectively. The voltage magnitude computed by the droop equation is scaled according to the voltage setpoint transmitted from the system controller. The resulting value is the voltage magnitude used in PWM generation.

The phase angle used in PWM signal generation is a function of two control processes. The first is a standard P/f droop equation, which generates a frequency value as a function of power output. The time-integral of this frequency term is a phase angle input to the PWM generation. The second control process is synchronization to the global phase reference. A phase angle offset is generated as the output of a PI controller which synchronizes the module's output voltage phase angle to the global synchronization reference generated by the system controller. This synchronization is accomplished by driving the difference in phase angles computed from the module's output voltage and synchronization signal to zero. These phase angles are calculated using SOGI-based PLLs. The PI controller's output is added to the phase angle calculated from the P/f droop control process to generate the final angle of the commanded voltage phasor. A standard PWM generation scheme is used to produce switching commands to the module's semiconductor devices based on the commanded voltage phase angle and magnitude.

The main difference between the primary-side and secondary-side control structures is the presence of a DC link control function. DC link control is accomplished by adjusting the phase angle reference to increase or decrease active power output to charge or discharge DC link capacitors. Because the DC link voltage at the secondary-side is controlled by the AC-DC stage of the module, the isolated DC-DC converter may be used to control the primary-side DC link voltage. In principle, this arrangement could be flipped, such that DC link voltage control is included in the primary-side AC-DC controller, and the isolated DC-DC converter controls DC link voltage at the secondary-side. However, DC link control is significantly more challenging at the primary side due to the coupling of series-connected modules' output voltage phase angles. In contrast, the output voltage phase angles at the secondary-side are independent, meaning the DC voltage of each module can be controlled without indirectly affecting the dynamics of adjacent modules. For this reason, DC link control is performed at the secondary-side.

Figure 11:
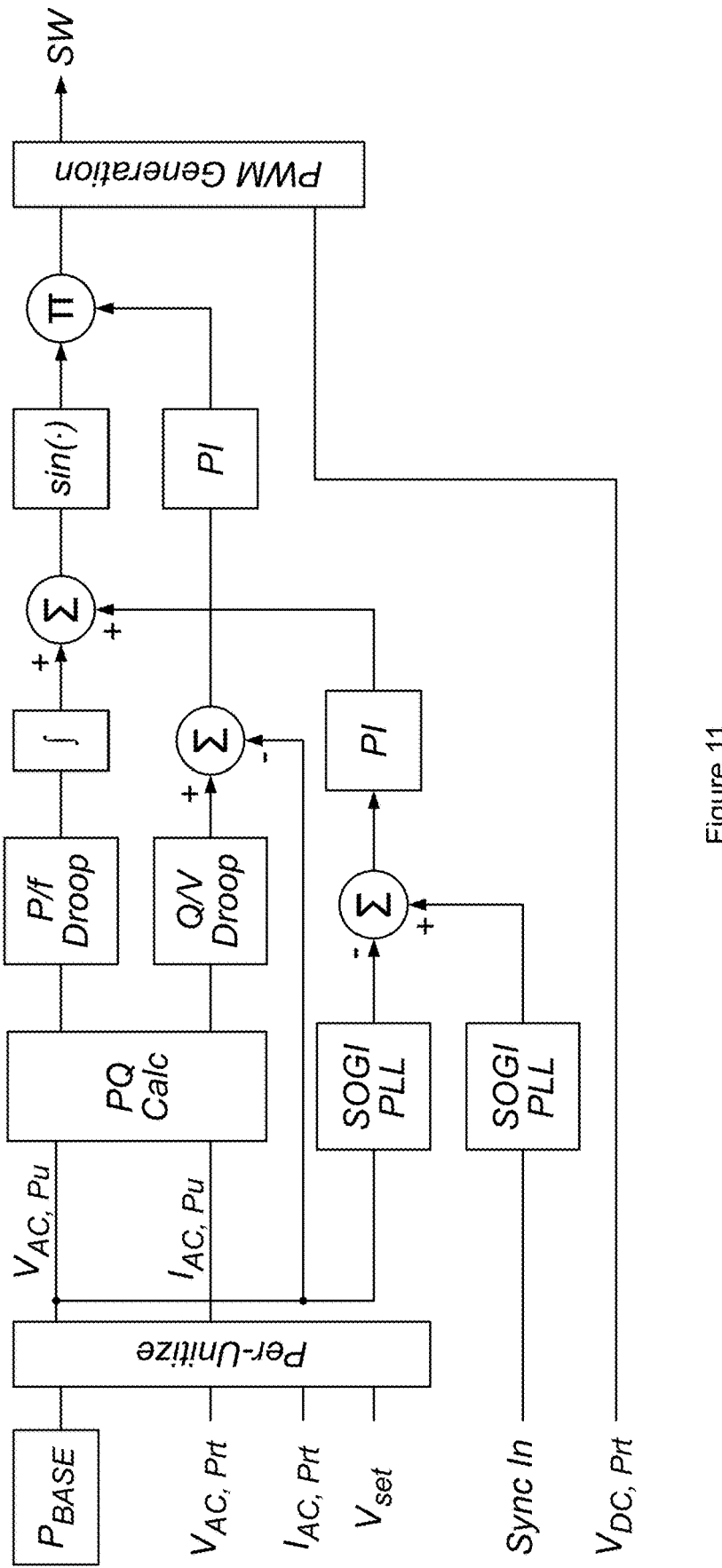
FIG. 11 shows a module controller (primary) block according to an embodiment of the invention.

FIG. 11 shows a standardized module controller that accepts the setpoints generated by the controller of FIG. 10 and sets the switching signals in the transformer module of FIG. 9. The module controller ensures proper synchronization via the synchronization signal provided by the system controller and regulates its own active power output and local AC voltage magnitude.

An embodiment of the disclosure can be understood from the discussion above regarding FIGS. 8-11, FIG. 8 shows a simple solid state power transformer performing the function of a conventional single-phase distribution transformer. FIG. 9 illustrates an embodiment of a transformer module that performs AC-AC power conversion and provides galvanic isolation through an internal high-frequency transformer to enable the modular ISOP structure in FIG. 8. FIGS. 10 and 11 illustrate a controller diagram wherein FIG. 10 is the system controller of the solid-state transformer that determines the setpoints to be provided to the module controller of FIG. 11 that accepts the setpoints and sets the switching signals in the transformer module. The system controller generates a module operational setpoint that is provided to the module controller to derive switching signals for a switching module. In an embodiment, the module operational setpoint may be voltage, power, current and/or reactive power. This transmission of setpoints from the central controller to the module uses a low bandwidth signal. The low bandwidth signal being between 10-300 Hz compared to the switching frequency of the switching module operating between 10-100 KHz. The switching module may be a collection of switches, passive components and a high frequency transformer (shown in FIG. 9.) Critically, the control and communication mechanism is invariant of the specific ratings or topology of the individual transformer modules, and it requires no switching signal synchronization between transformer modules.

While the switching module uses a low-bandwidth signal, it's more that the whole system functions with low-bandwidth signals. This disclosure allows large populations of modules without massive communication requirements. The system distributes the intelligence among the module controllers, so that each individual module can operate on its own with only minimal information (setpoints) provide by the central controller.

Base Simulation Results

Figure 12:
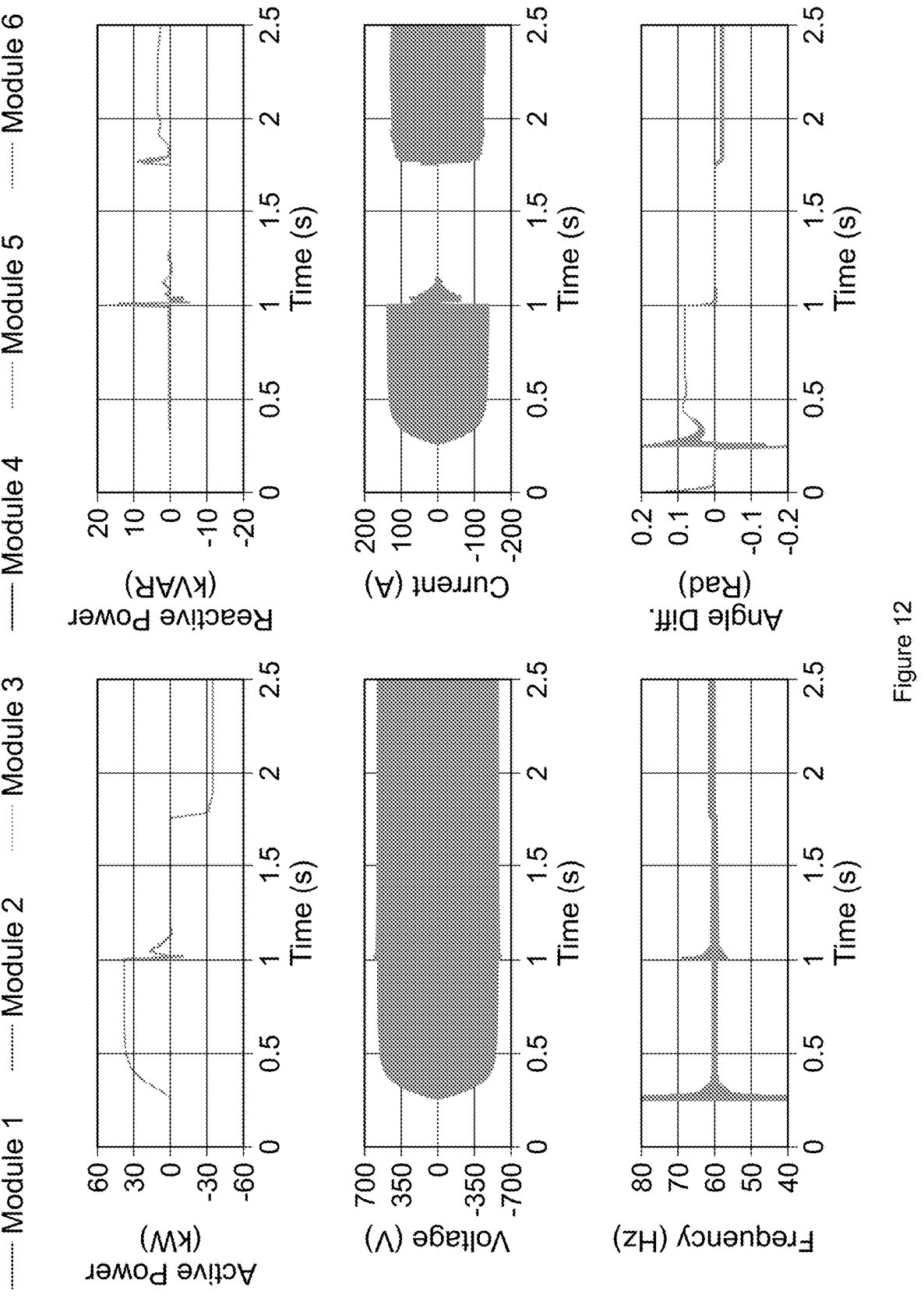
FIG. 12 shows a primary-side module responses in SST with identical modules.
Figure 13:
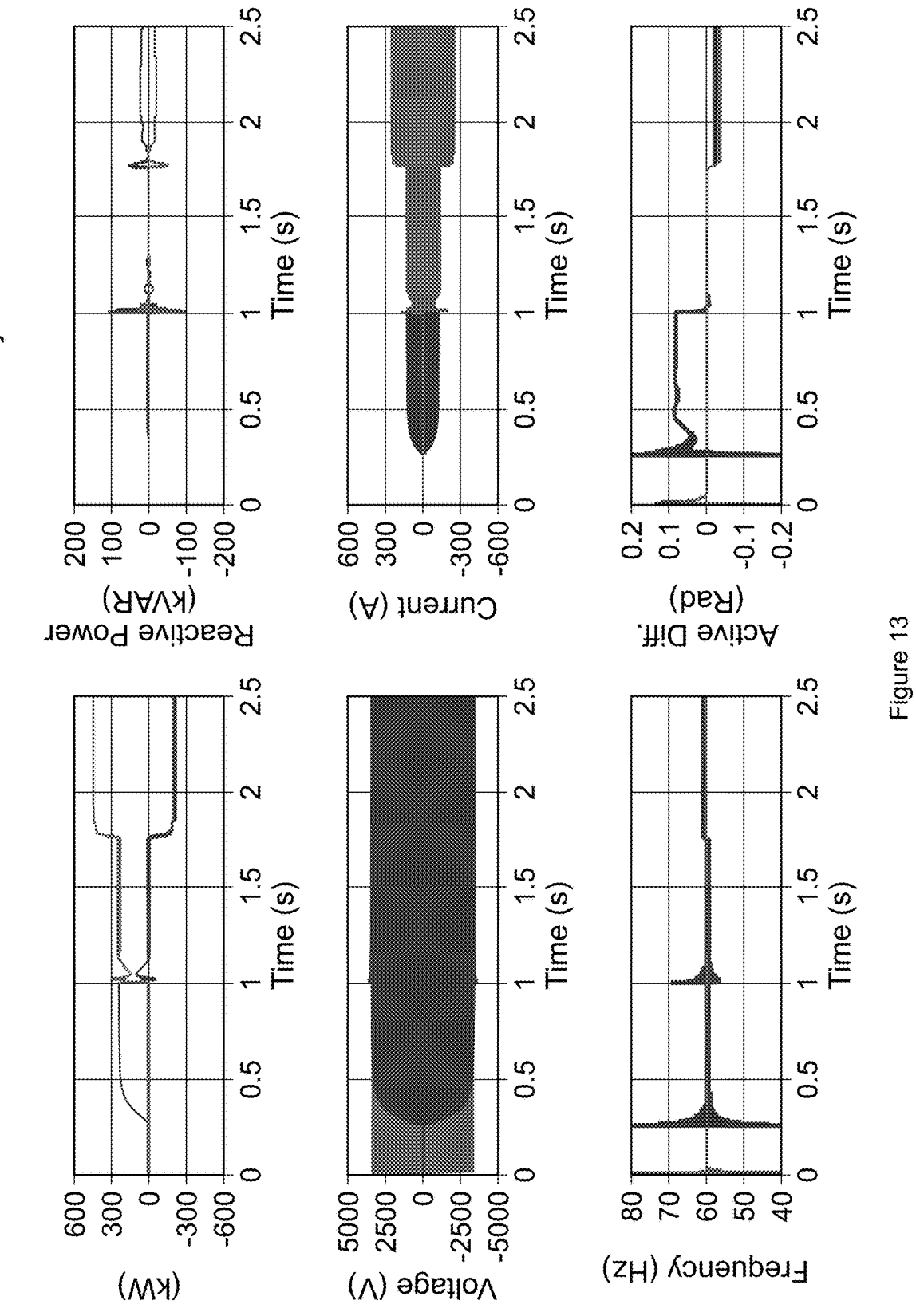
FIG. 13 shows a primary-side system responses in SST with identical modules.
Figure 14:
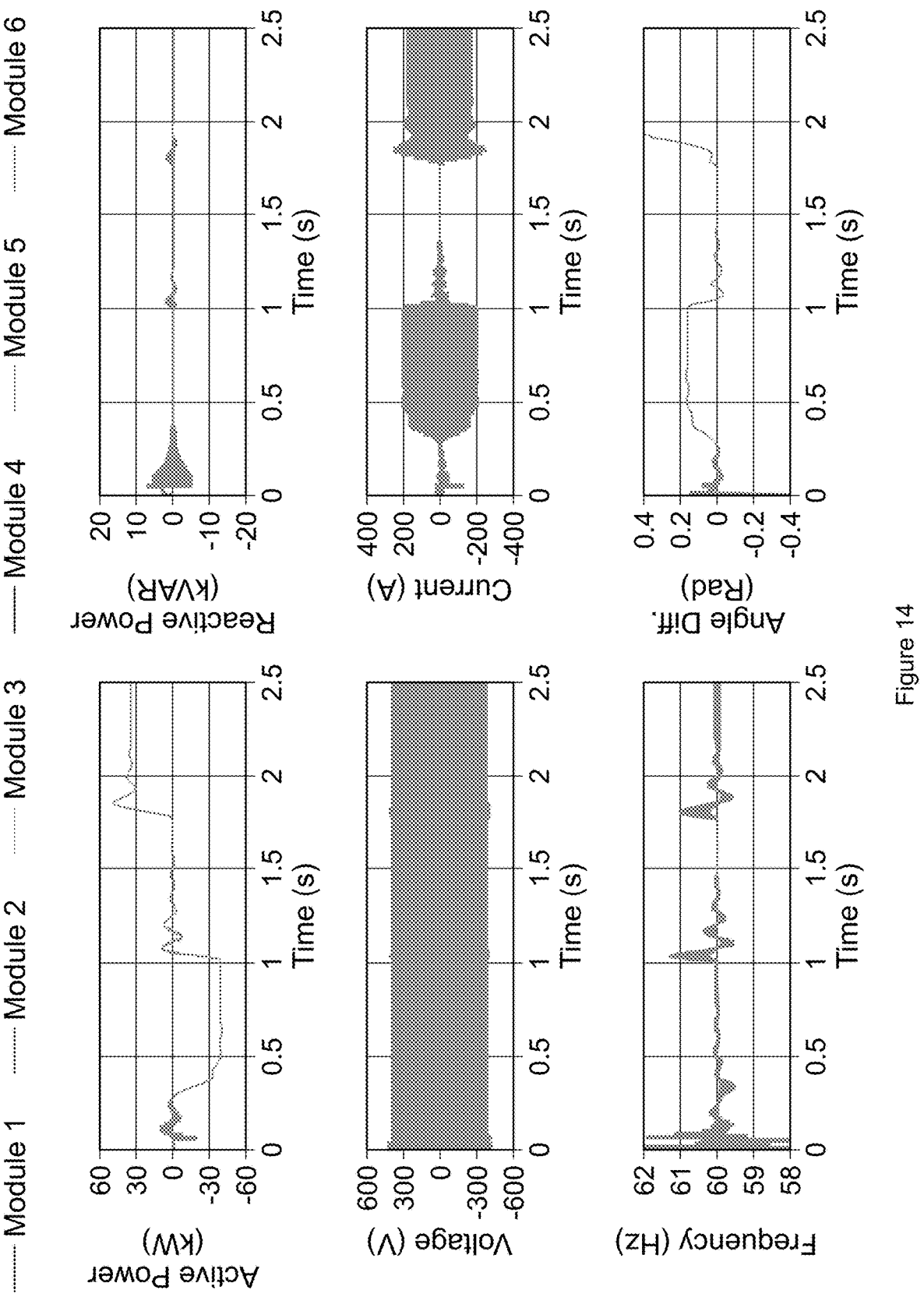
FIG. 14 shows a secondary-side module responses in SST with identical modules.
Figure 15:
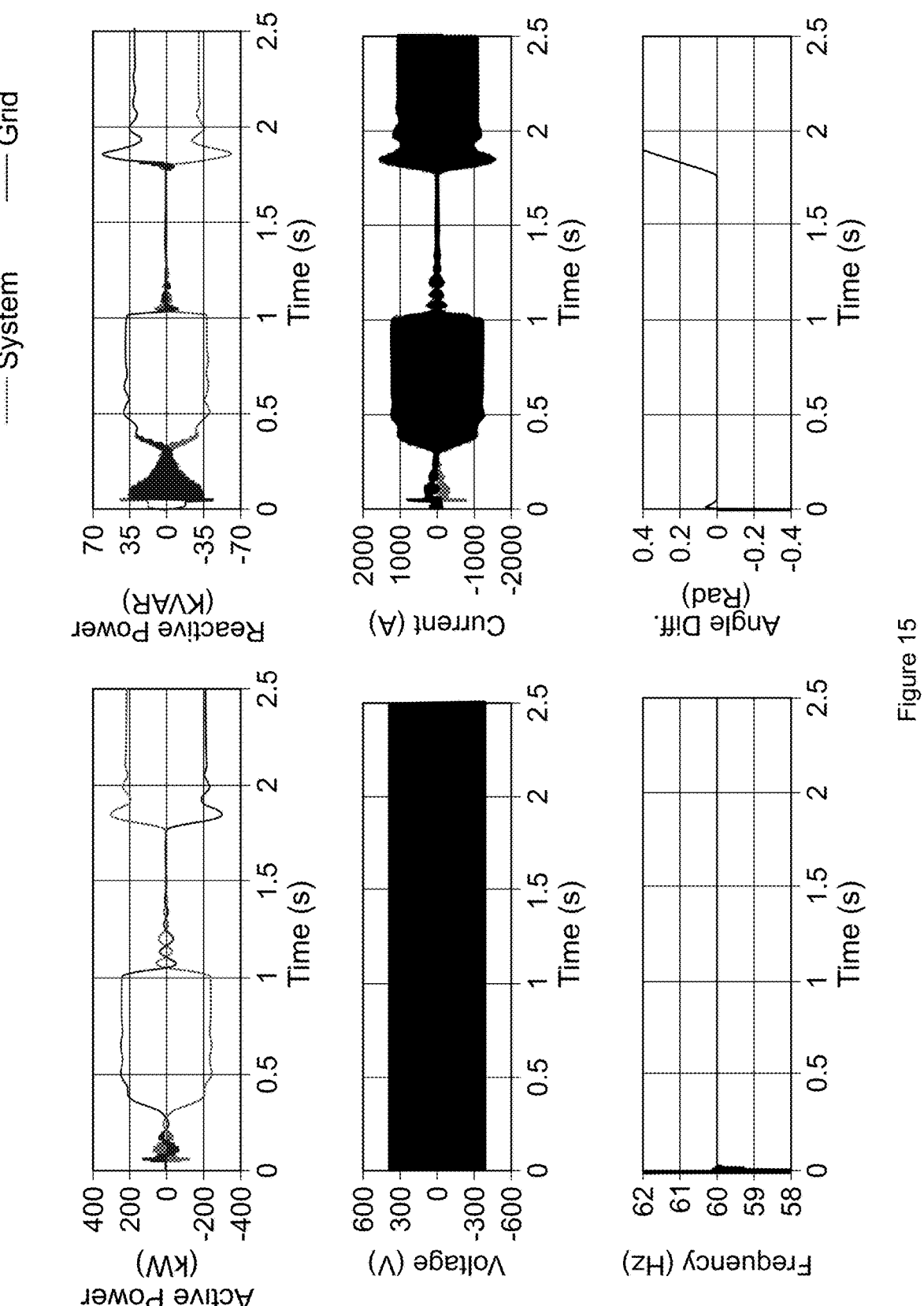
FIG. 15 shows a secondary-side system responses in SST with identical modules.

Results of the base simulation are shown in FIG. 12 through FIG. 15. FIG. 12 and FIG. 13 show primary side module and system-level waveforms, respectively; FIG. 14 and FIG. 15 show secondary side module and system-level results. Each figure shows active power, reactive power, AC voltage, AC current, frequency, and an angle difference. For the module waveforms, the angle difference corresponds to the difference between phase angle of the synchronization signal and the phase angle of the module's local AC output voltage phasor. Referencing all phase angles to this common synchronization reference simplifies visualization of module-to-module phase differences. Similarly, for system waveforms, the angle difference corresponds to the phase angle difference between the synchronization signal and the system-level AC voltage and grid voltage phasors.

System-level and module-level voltage and current polarities are indicated in the schematics of FIG. 8 and FIG. 9. Note that source convention is used at all AC terminals. That is, positive power corresponds to power sourced by a given AC port. Because this convention is applied to both primary and secondary-side terminals, power greater than 0 at the primary side corresponds to power less than 0 at the secondary side, and vice versa. The same is true of the AC sources representing the primary and secondary grids.

The simulation runs for a period of 2.5 seconds, and in this time transitions through several salient modes of operation. During the first stage of the simulation, prior to t=0.25s, the primary side of the SST is fully deenergized and disconnected from the 2400V grid. The secondary side is connected to the low-voltage 277V grid, but the control system is inactive until t=0.05s. Before t=0.05s, only the secondary-side PLLs in individual module controllers are operating, such that the modules have locked to the secondary grid phase and frequency before module PWM outputs are engaged.

At t=0.05s, the secondary-side controllers are activated and begin regulating their individual DC link voltages. Power drawn from the secondary grid is low between t=0.05s and 0.25s; because the primary side is not operating, only enough energy is sourced from the secondary grid to charge DC link capacitors.

At time t=0.25s, the primary side of the SST is activated. The system starts in islanded operation, serving a purely resistive 256Ω load. Power output rises gradually with AC output voltage. At steady state, this load draws approximately 230kW. The load is shared equally between the six identical modules, each contributing 38 kW.

At time t=1.0s, a contactor on the primary side closes and the system begins operating in grid-connected mode, with output power setpoints determined internally by droop equations. Because the primary-side grid is stiff and has a frequency of 60 Hz, the P/f droop equation reduces the SST's output power to zero. The 250Ω load is supported by power sourced from the grid.

At time t=1.5s, the primary-side grid experiences a frequency excursion, shifting from 60 Hz to 60.5 Hz. In response, the SST begins to sink power from the primary-side grid in accordance with the modules' P/f droop equations. This operation demonstrates two key capabilities of the SST: support for bidirectional power flow and interconnection of asynchronous grids. Phase angle differences for the secondary-side system and module plots (the bottom right plots in FIG. 14 and FIG. 15) reflect this difference in frequency. These phase angles are referenced to the primary-side synchronization signal, which matches the phase and frequency of the primary-side grid. Consequently, the difference in angle from the secondary side, which does not undergo a frequency shift, begins to ramp up starting from 1.5s.

Figure 16:
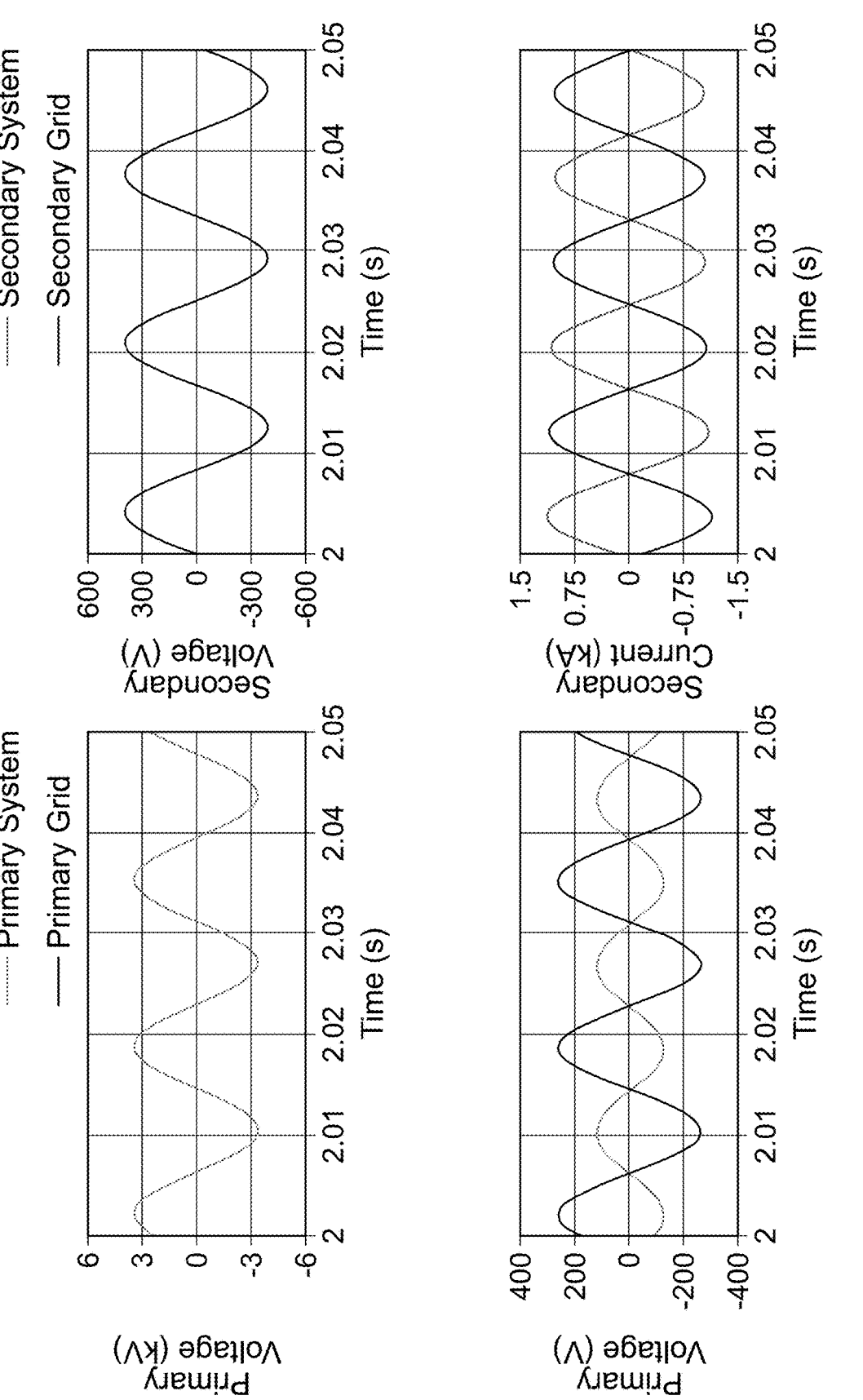
FIG. 16 shows an inset of system-level voltage and current waveforms for identical modules.
Figure 17:
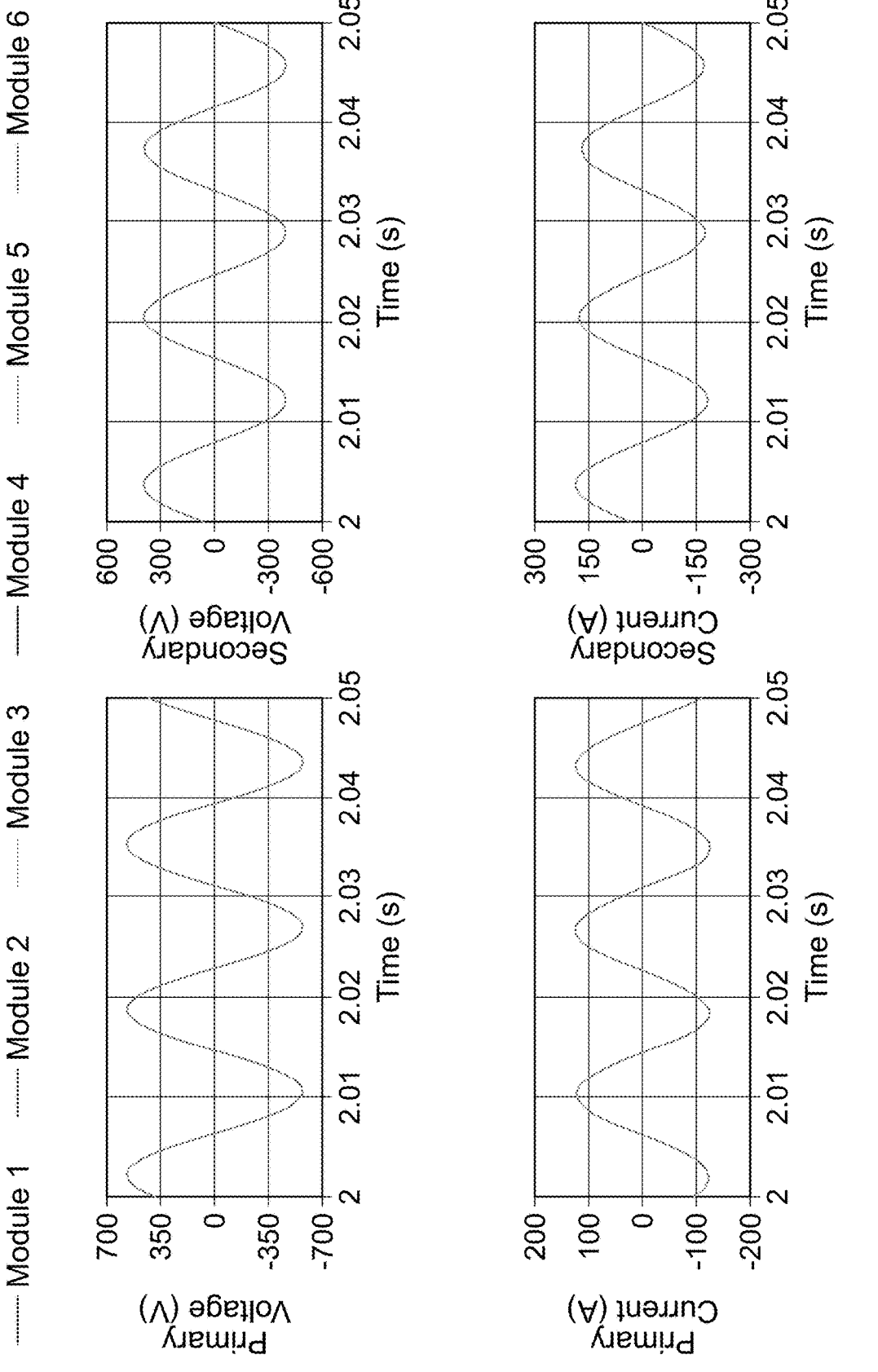
FIG. 17 shows an inset of module-level voltage and current waveforms for identical modules.
Figure 18:
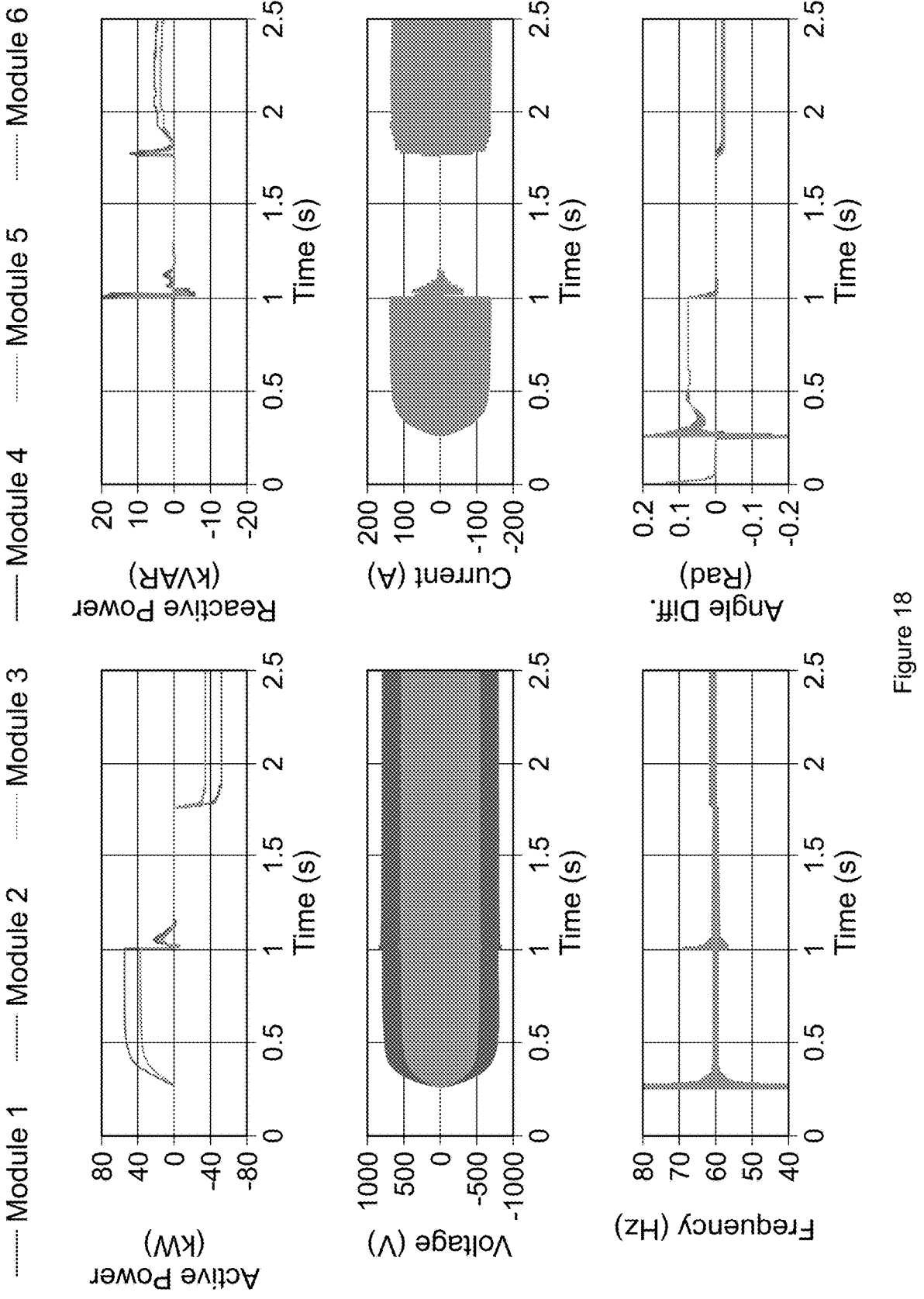
FIG. 18 shows a primary-side module responses in SST after module 2 replacement.
Figure 19:
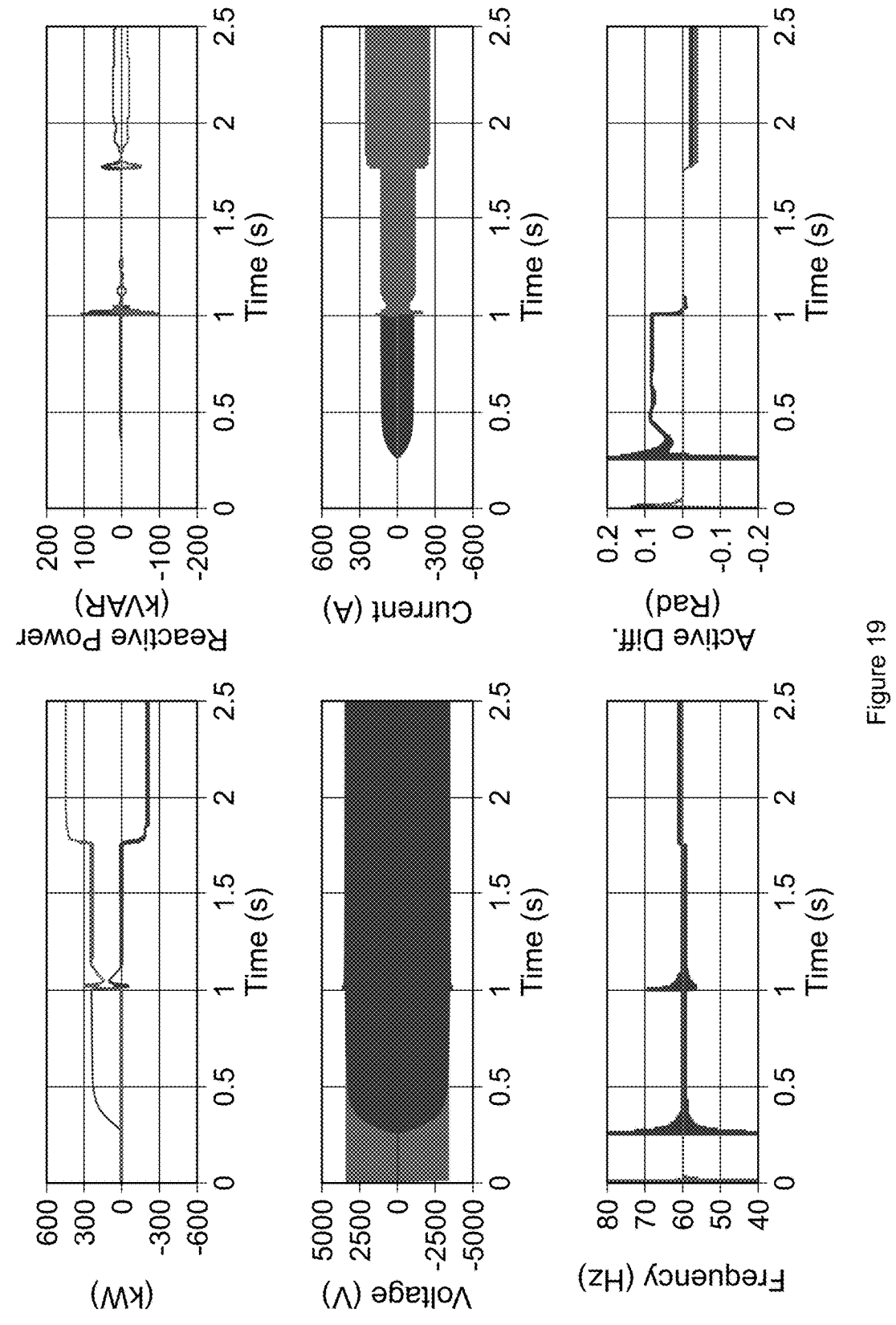
FIG. 19 shows a primary-side system responses in SST after module 2 replacement.
Figure 20:
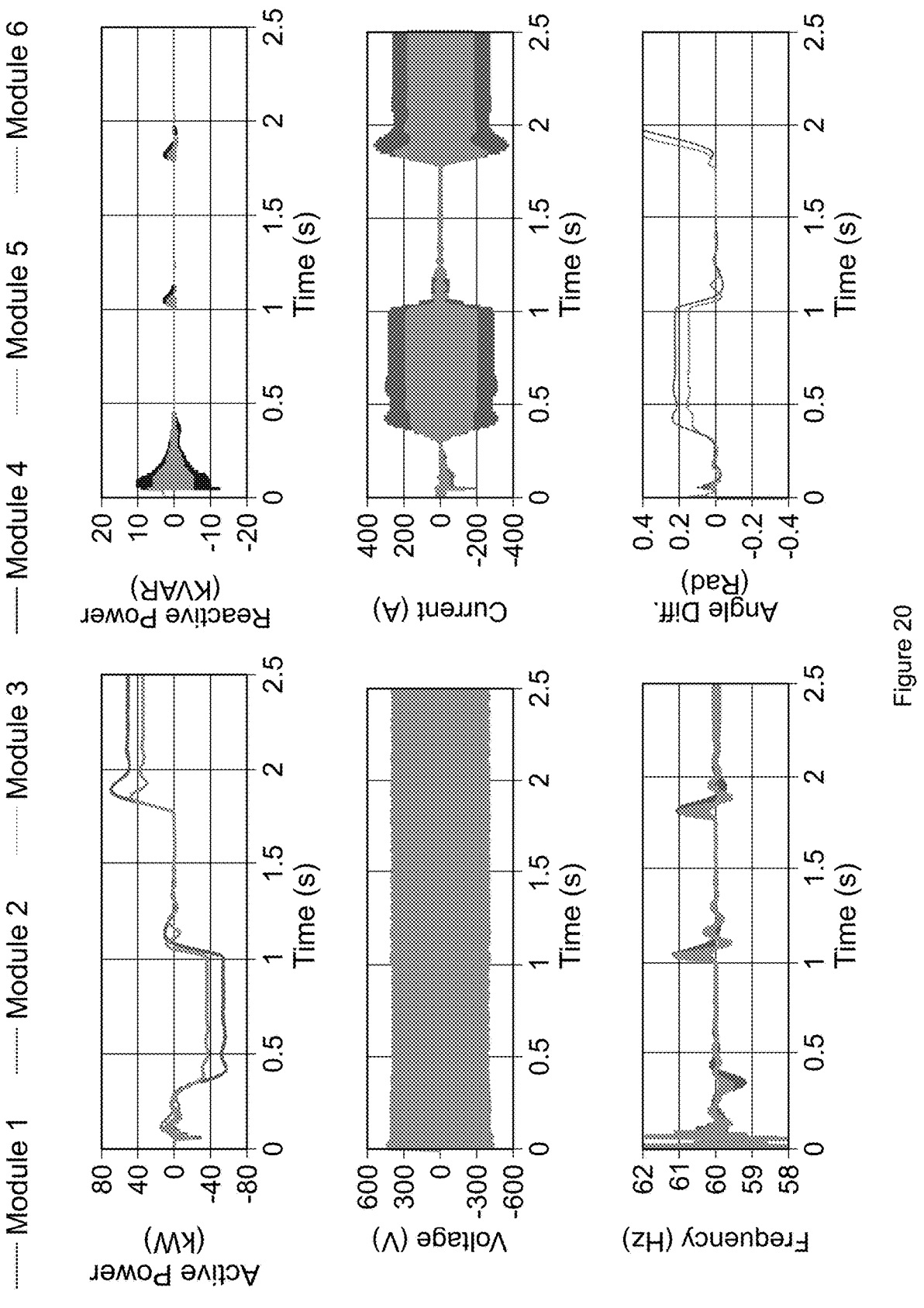
FIG. 20 shows a secondary-side module responses in SST after module 2 replacement.
Figure 21:
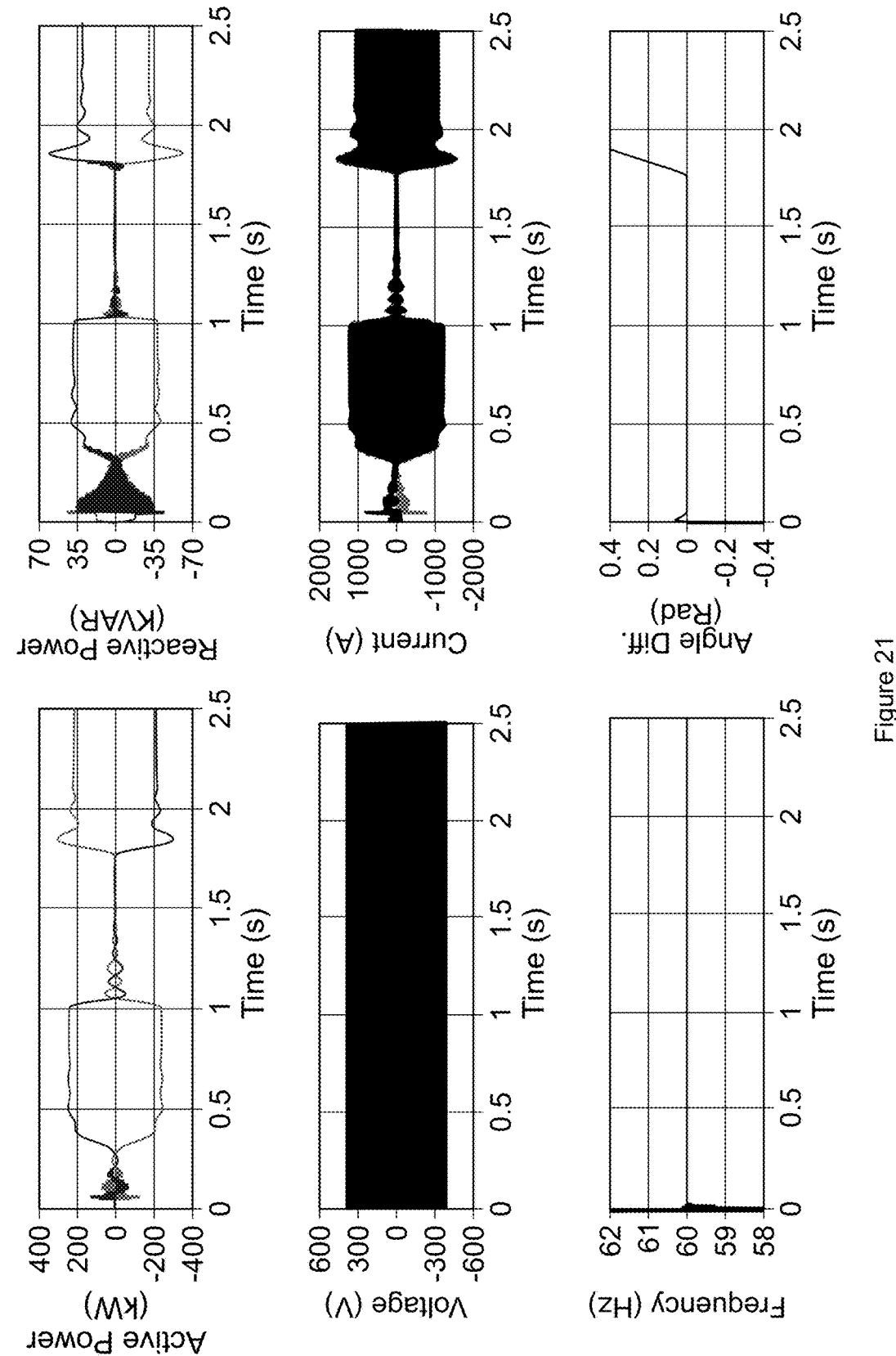
FIG. 21 shows a secondary-side system responses in SST after module 2 replacement.

Insets of steady-state voltage and current waveforms at the system and module level are shown in FIG. 16 and FIG. 17, respectively. These figures show a duration of 50 ms, or three periods of the 60 Hz line cycle, starting from t=2s. This steady-state snapshot occurs in the final phase of the simulation, when the primary side grid is operating at 60.5 Hz and the secondary side grid is operating at 60 Hz. The difference in phase angles due to disparate grid frequencies is clear at this time scale.

Throughout the base simulation, each module shares equal voltage on the primary side and equal current on the secondary side. Because the modules are identical, module-level waveforms overlap. This represents an ideal case for multi-module system operation. The following subsections explore the impact of module nonuniformities on this idealized result.

Module Replacement Scenario: System Changes

Module replacement is perhaps the single most important function of the modular building block framework. The ability to replace aged modules allows the operational life of the system to be extended far beyond the service life of its individual components. In addition to simply maintaining system-level performance, if newer and more advanced modules are incorporated as replacements, system-level performance can actually be improved over time. However, this requires the system to seamlessly adapt to changes in module parameters.

The second simulation is intended to emulate a case in which one module is replaced with a non-identical alternative. In this scenario, the original system was installed with "Generation 1" modules with the parameters shown in Table 2. Several years after initial installation, a "Generation 2" module is released by the module manufacturer. The Generation 2 module is a direct upgrade within the same physical footprint. The new version uses higher voltage semiconductors (1800V instead of 1200V), making it possible to use a higher DC link voltage and nominal AC voltage on the primary side. As a result, the Generation 2 module offers 50% higher power capacity than the Generation 1 modules. Parameters of the Generation 2 module are shown in Table 3.

TABLE 3

Upgraded module hardware and control parameters.

| Parameter | Primary-Side Value | Secondary-Side Value |
|---|---|---|
| Rated Power | 90 kVA | 90 kVA |
| Nominal DC Link Voltage | 1125 V | 1125 V |
| Nominal AC Voltage | 600 V | 277 V |
| AC Filter Capacitance | 100 μF | 100 μF |
| AC Filter Inductance | 800 μH | 1200 μH |
| DC Link Capacitance | 1200 μF | 1200 μF |
| Switching Frequency | 10 kHz | 10 kHz |

Simulation results for the module replacement scenario are shown in FIG. 18 through FIG. 21. There are three results shown in these figures. First, system stability is not affected by the module replacement. The system transitions through the same sequence of operations as the baseline case and its dynamic responses are largely unchanged.

Figure 22:
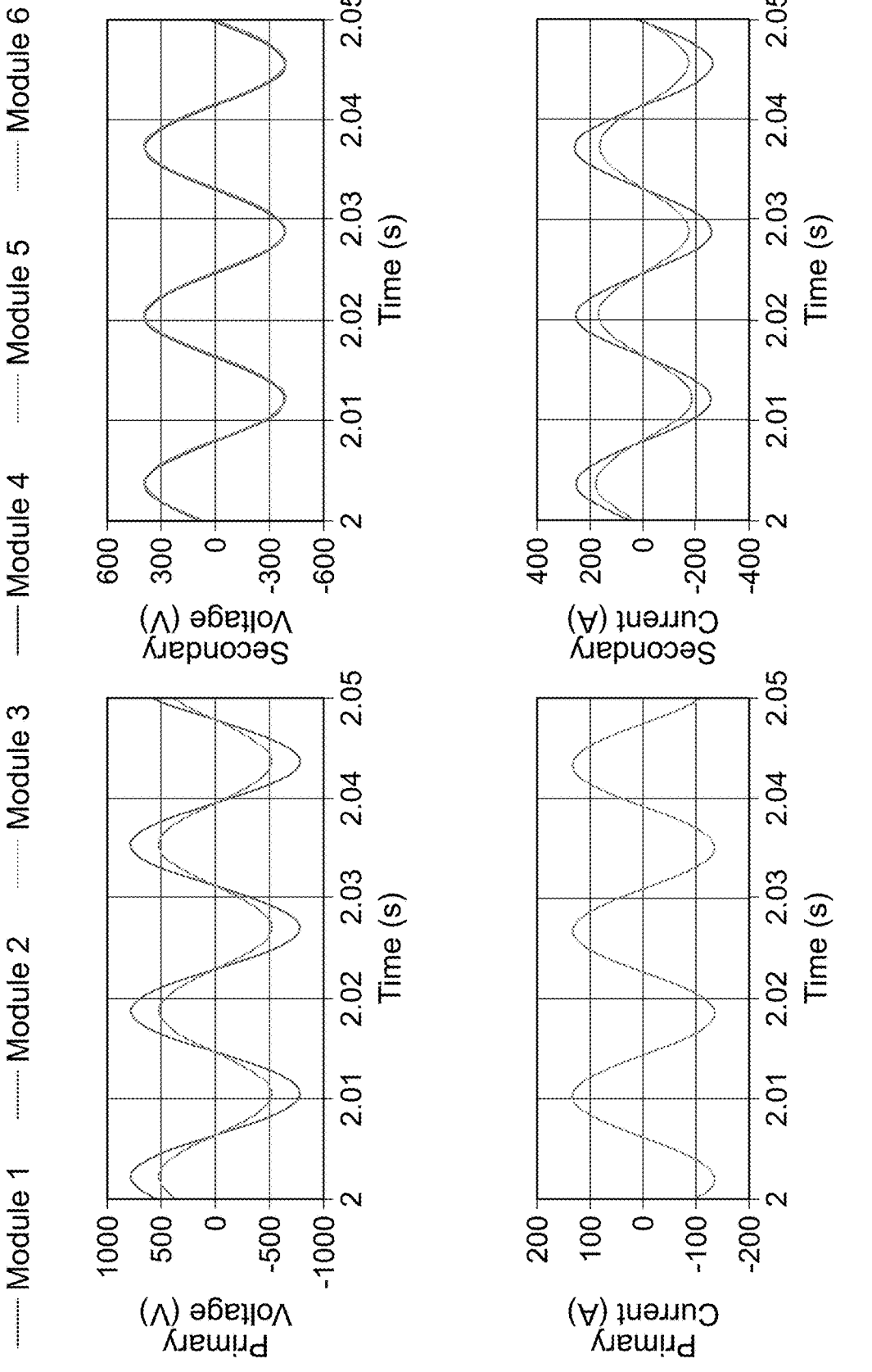
FIG. 22 shows an inset of module-level voltage and current waveforms for upgraded module case.

The second result is that both active and reactive power sharing occurs in proportion to the modules' rated capacities, as expected. Module 2, the replaced module, carries 50% higher power throughout the simulation. The higher power corresponds to higher AC voltage at the primary side and higher AC current at the secondary side. This is the expected behavior for ISOP power sharing, as described above. FIG. 22, an inset showing steady-state behavior at time t=2s, more clearly shows module 2's increased current and voltage magnitudes.

The third important outcome from the module replacement simulation is a reduction in stresses and loading of other modules for a given operating condition. At the primary side, since the system-level voltage magnitude remains constant, module 2's increased voltage capabilities lead to a slight decrease in the voltage magnitudes of the other series-connected modules. The reduction is proportional to the change in total system-level AC voltage rating, which corresponds to the sum of individual modules' primary-side voltage ratings. This slight change indicates that while a single module replacement is unlikely to radically alter the power processing capabilities of a system, the accumulated change of multiple module replacements over time can increase the power and voltage ratings of an existing system.

Non-Uniform Module Scenario: System Changes

In the third simulation, a variety of module nonuniformities are introduced throughout the system. The changes applied do not follow a specific use case, but instead probe the extent of the systems' support for module nonuniformity. Changes with respect to the base simulation and module parameters in Table 1 are as follows:

i. Module 1: DC link voltage, rated AC output voltage, and module power rating increased by 20%.

ii. Module 2: Switching frequency increased to 10 kHz.

iii. Module 3: Primary-side AC filter capacitor increased to 150 μF.

iv. Module 4: Primary-side filter inductors reduced to 200u H v. Module 5: Primary-side AC voltage setpoint increased by 50V.

vi. Module 6: Primary-side AC voltage setpoint decreased by 50V.

The changes to modules 5 and 6 are entirely arbitrary and do not correspond to any physical change in module composition. Instead, these changes involve only the setpoints transmitted by the system controller. These are included to demonstrate system functionality for modules with uniform hardware operated at different loading conditions.

Results of the nonuniform module simulation are shown in FIG. 23 through FIG. 27. As in previous cases, the first two figures show module and system-level dynamics at the primary side, the second two show module and system-level dynamics at the secondary, and the last shows an inset of voltage and current waveforms at t=2.0s.

Figure 23:
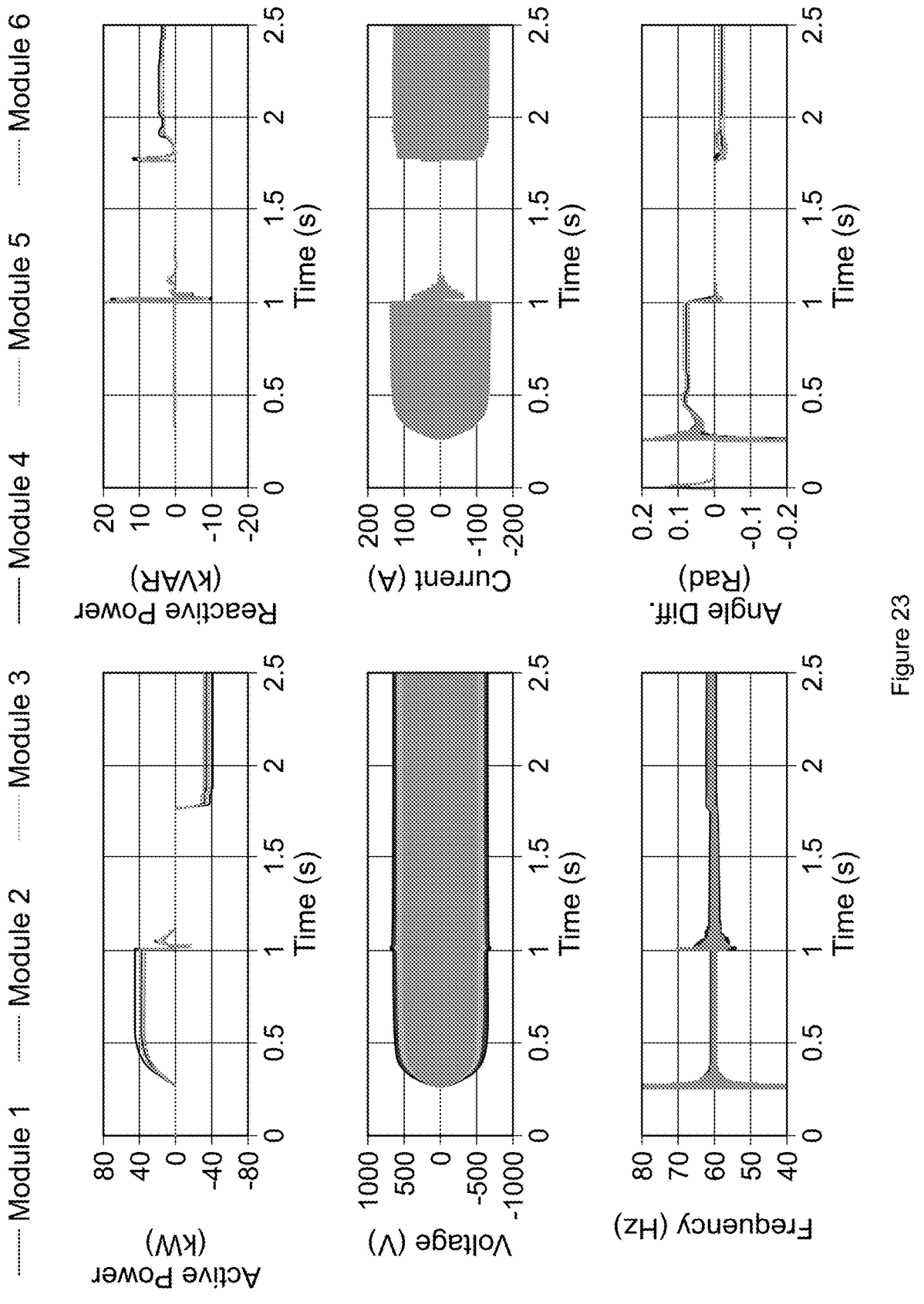
FIG. 23 shows primary-side module responses in SST with non-uniform module parameters
Figure 24:
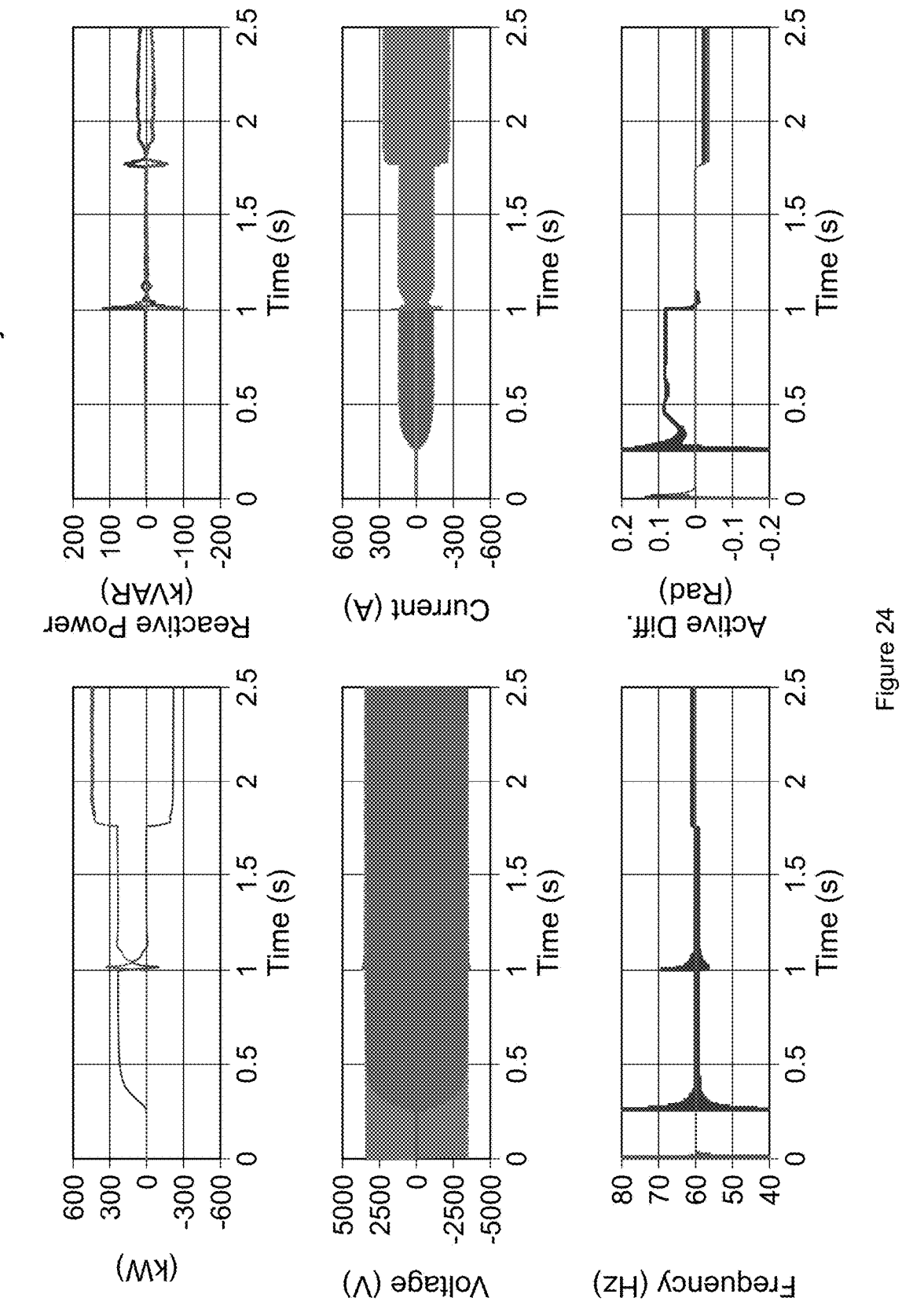
FIG. 24 shows primary-side system responses in SST with non-uniform module parameters.
Figure 25:
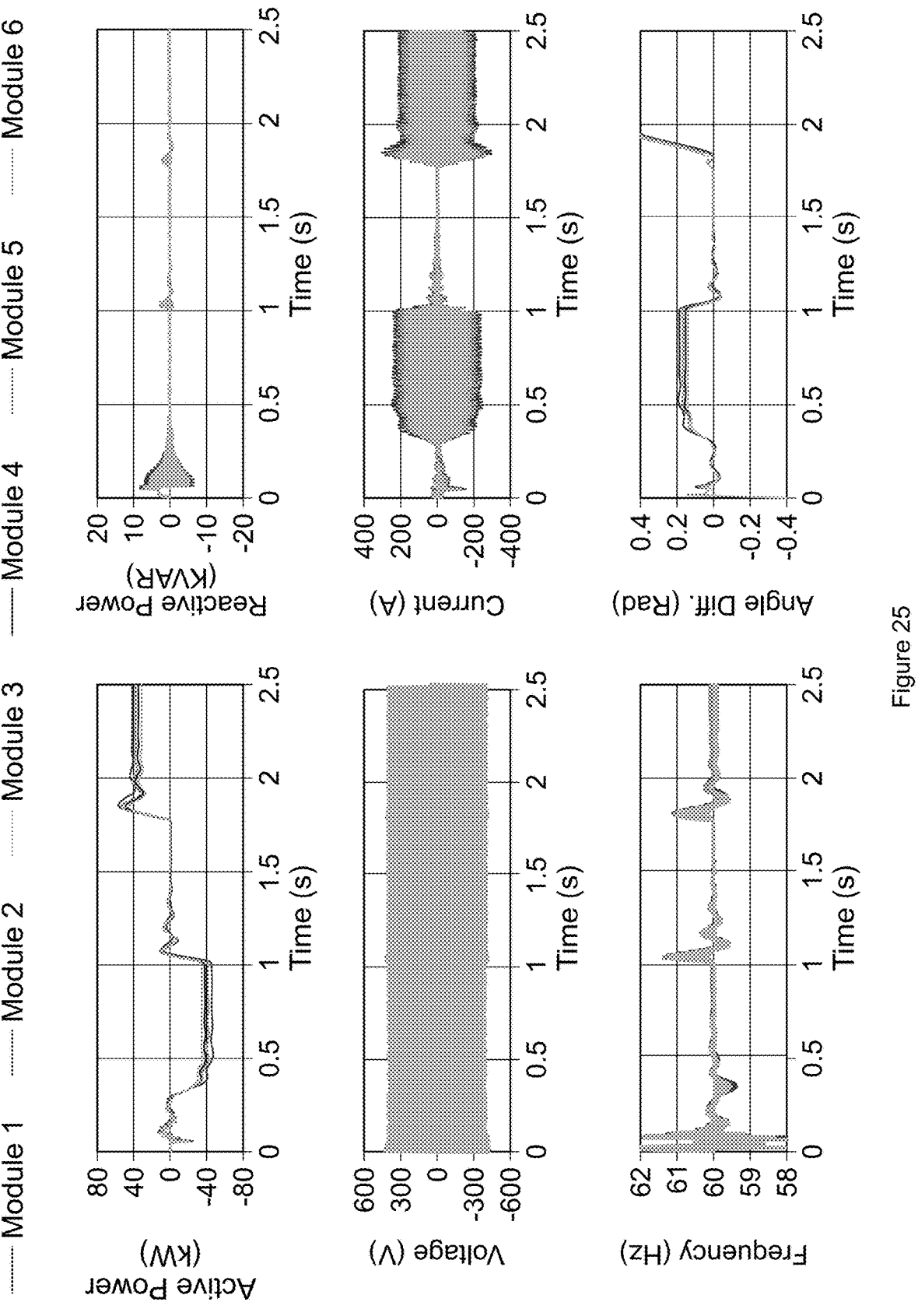
FIG. 25 shows secondary-side module responses in SST with non-uniform module parameters.
Figure 26:
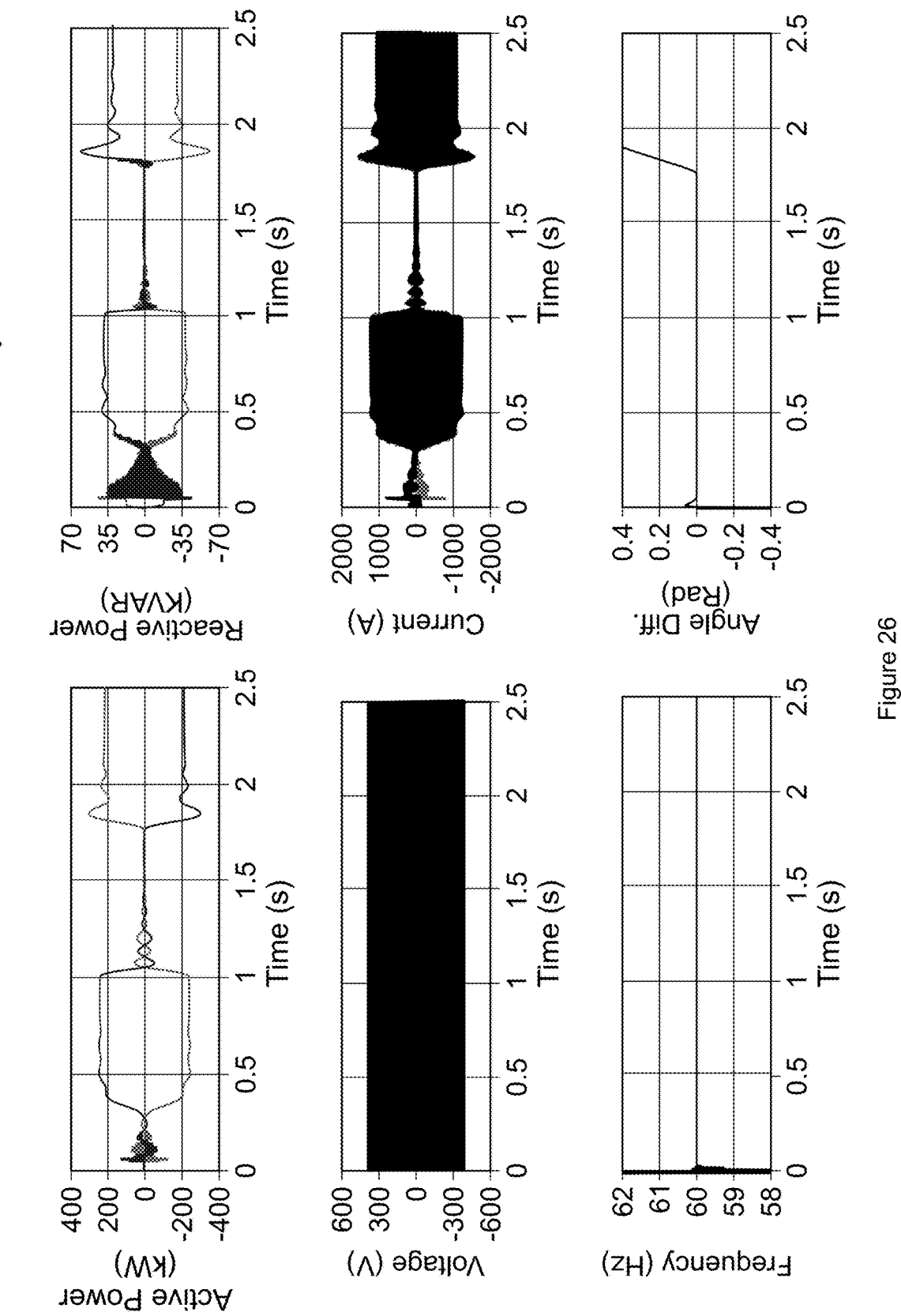
FIG. 26 shows secondary-side system responses in SST with non-uniform module parameters.
Figure 27:
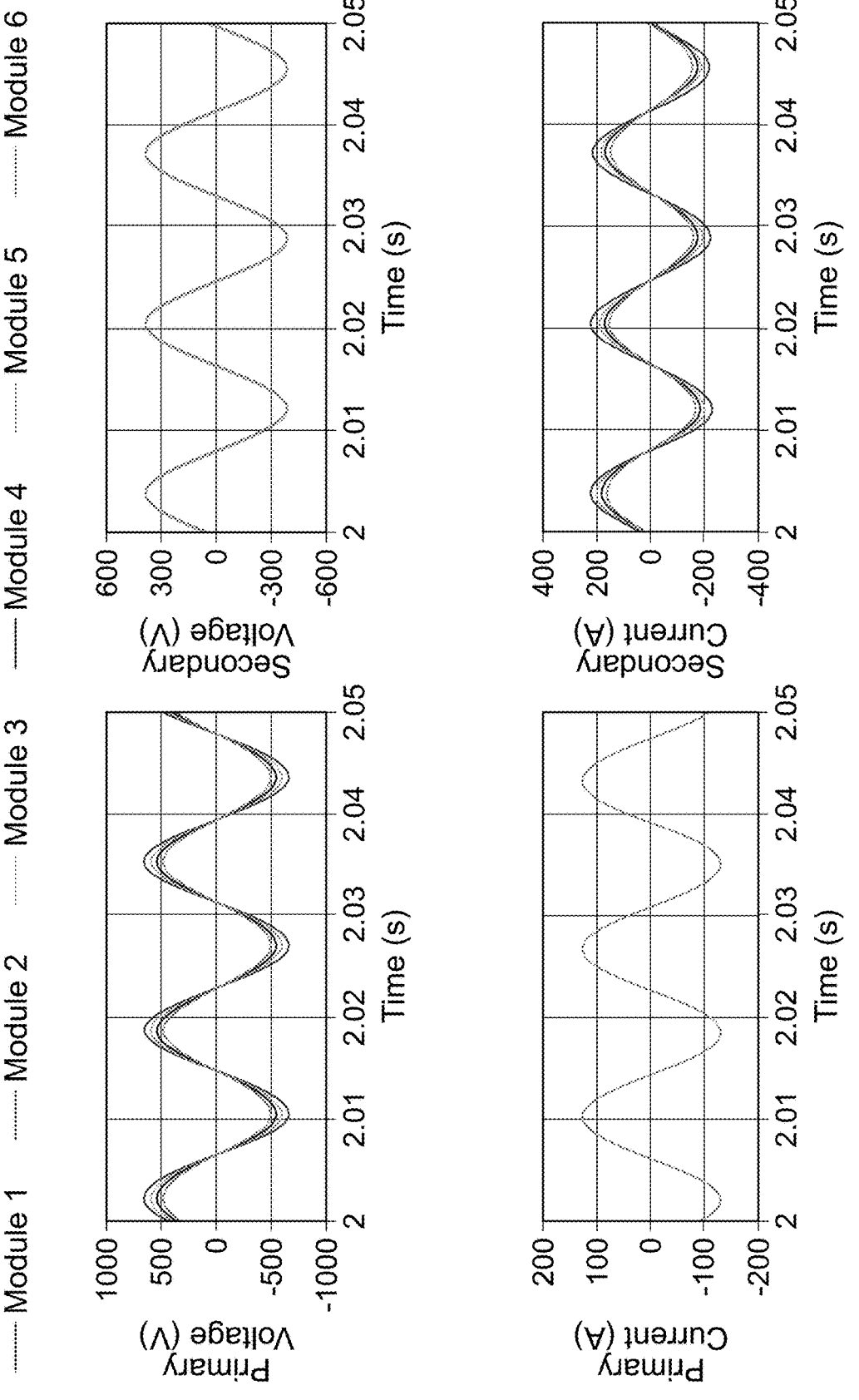
FIG. 27 shows an inset of module-level voltage and current waveforms for nonuniform modules.

FIG. 23 shows four distinct module power values for a given system-level output.

This is the expected result based on the modules' AC output voltage setpoints. Module 1 has the highest AC output setpoint due to its 20% higher voltage ratings. Modules 2, 3, and 4 have the same rated AC output as the base case. These modules' output power waveforms overlap and are unaffected by their respective frequency and output filter element changes. The 50V increase and decrease to the voltage setpoints of modules 5 and 6 causes them to carry higher and lower power than the base case modules.

Three-Phase SST System: System Structure and Controls

Figure 28:
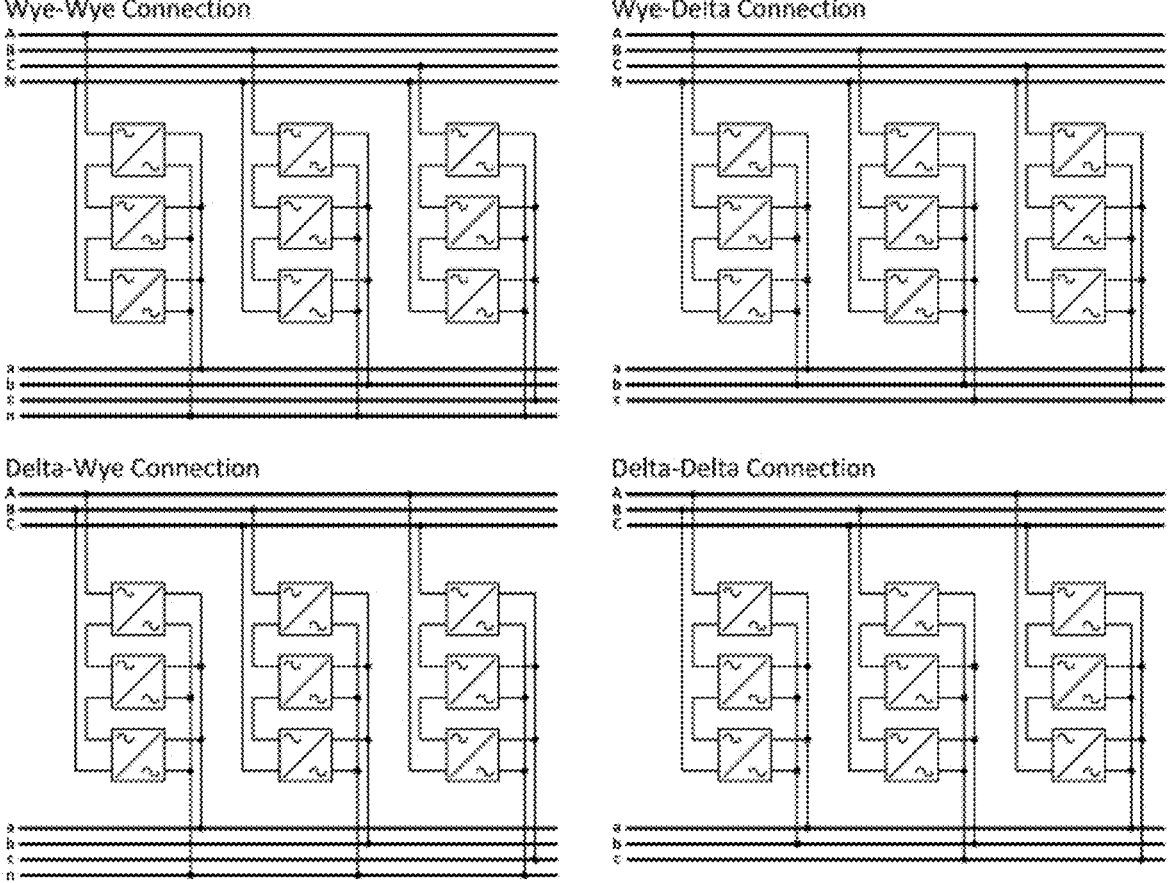
FIG. 28 shows possible connection topologies for three-phase modular SST according to an embodiment of the disclosure.

The hierarchical control scheme developed for system and module control in a single-phase SST is generalizable to a three-phase SST. Both Wye (neutral referenced) and Delta (floating) connection configurations are possible at the primary and secondary side (FIG. 28). Conceptually, the three-phase systems shown in FIG. 28 may be understood as three instances of the single-phase system described in previous sections with primary and secondary ports connected either line-to-line or line-to-neutral as needed by the three-phase application.

The control scheme for the three-phase SST is similar to the single-phase implementation described previously. While it is possible to use the same control scheme as the single-phase unit (for the A phase) and derive the B and C phases using set offsets ($+2\pi/3$ and $-2\pi/3$), this limits stability and applicability, especially under weak and abnormal grid conditions. For this reason, controls are implemented independently for each phase. This means that each phase has its own voltage setpoint and phase angle offset. While the nominal phase difference is still $2\pi/3$ radians, the independent PLL allows for deviations from this nominal value match grid frequency. The gains and PI constants are common to each phase, so similar dynamics are expected.

The single-phase SST and the three-phase systems shown in FIG. 28 are constructed from the same single-phase AC-AC converter building block. The universality of the single-phase building block is advantageous. However, in cases where modules are connected exclusively in parallel at the secondary side the total number of switching elements may be reduced by paralleling modules at the secondary-side DC link and replacing the single-phase AC-DC stages with three-phase bridge circuits. Since the DC link in a three-phase bridge must exceed peak line-to-line voltage this change would increase the blocking voltage requirements for secondary side switches by a factor of $\sqrt{3}$, but the total number of switches involved in secondary-side conversion would be reduced by 50%. This assumes switches used in the three-phase bridge have current ratings equal to those of the single-phase H-bridge being replaced.

Additionally, this change may lead to simplifications in secondary-side control due to the elimination of 120 Hz ripple components at the DC link. For SST applications involving low voltage secondary-side grids, these benefits may be significant enough to justify deviation from the universal AC-AC module format. However, for any SST applications involving secondary voltages high enough to require cascaded module configurations, these changes are not possible. In keeping with this report's focus on modularity as a driving principle, only three-phase systems constructed from AC-AC building block modules are considered in the simulation results that follow.

Figure 29:
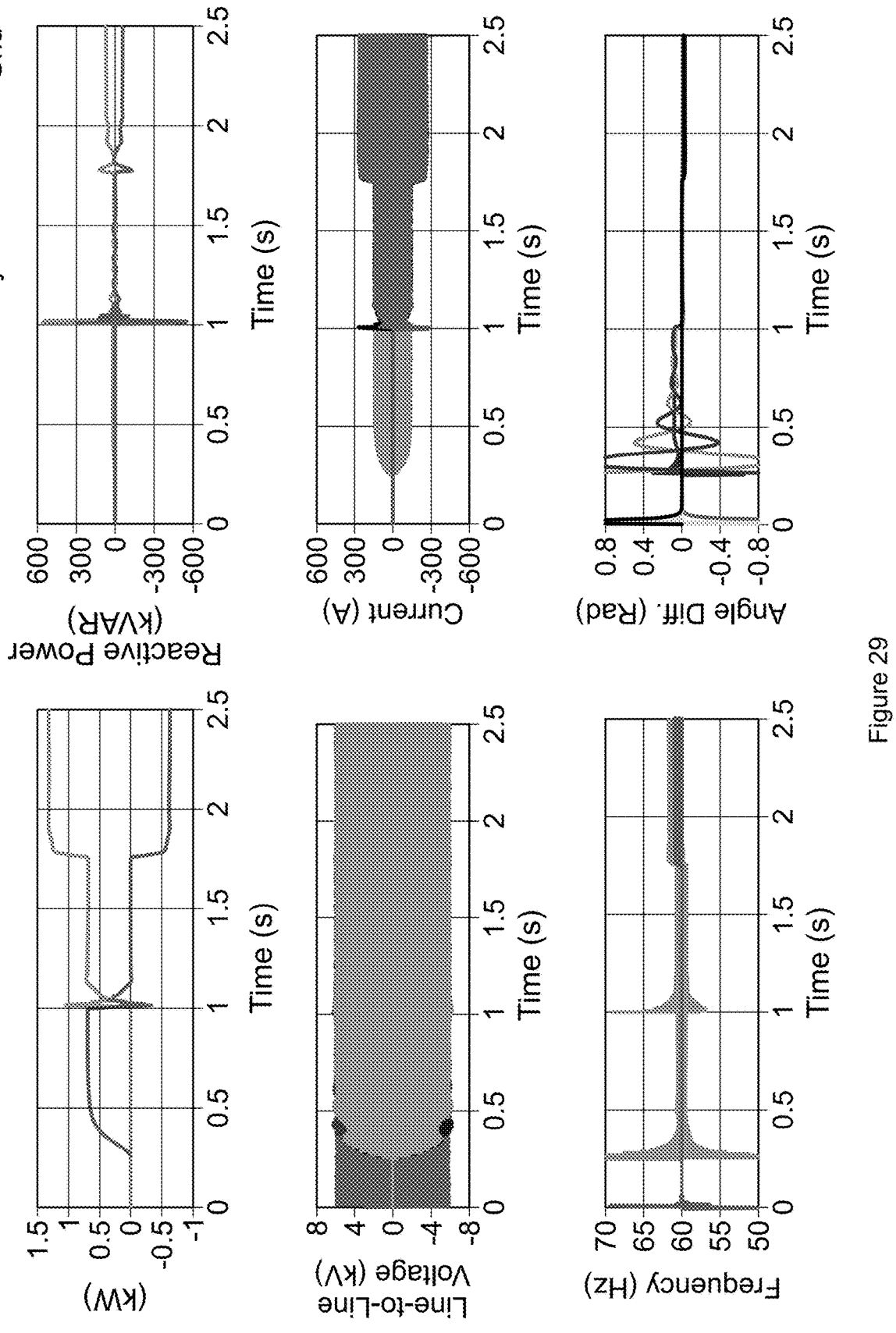
FIG. 29 shows primary-side system responses in a three-phase Wye-Wye connected SST.
Figure 30:
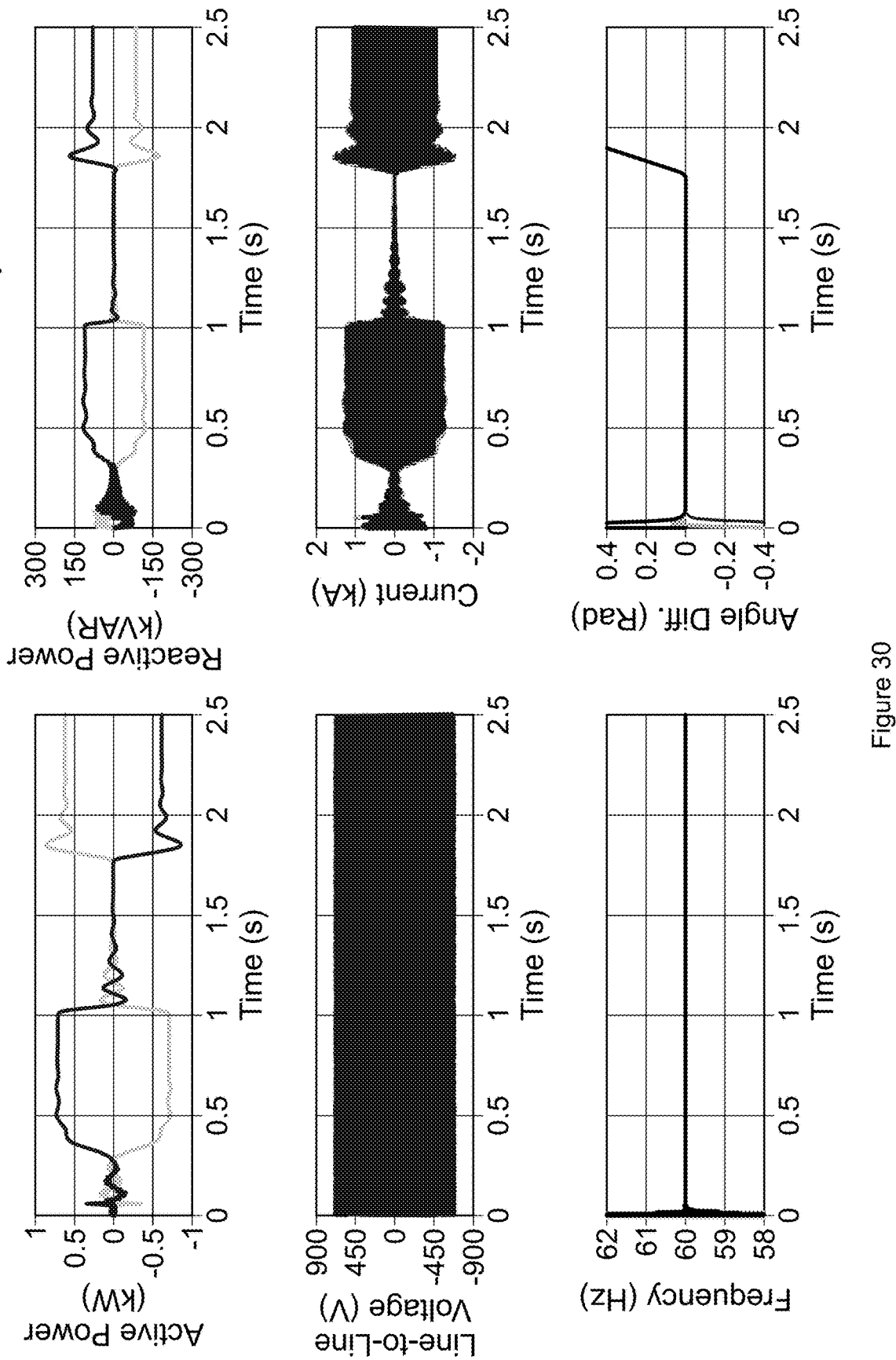
FIG. 30 shows secondary-side system responses in a three-phase Wye-Wye connected SST.
Figure 31:
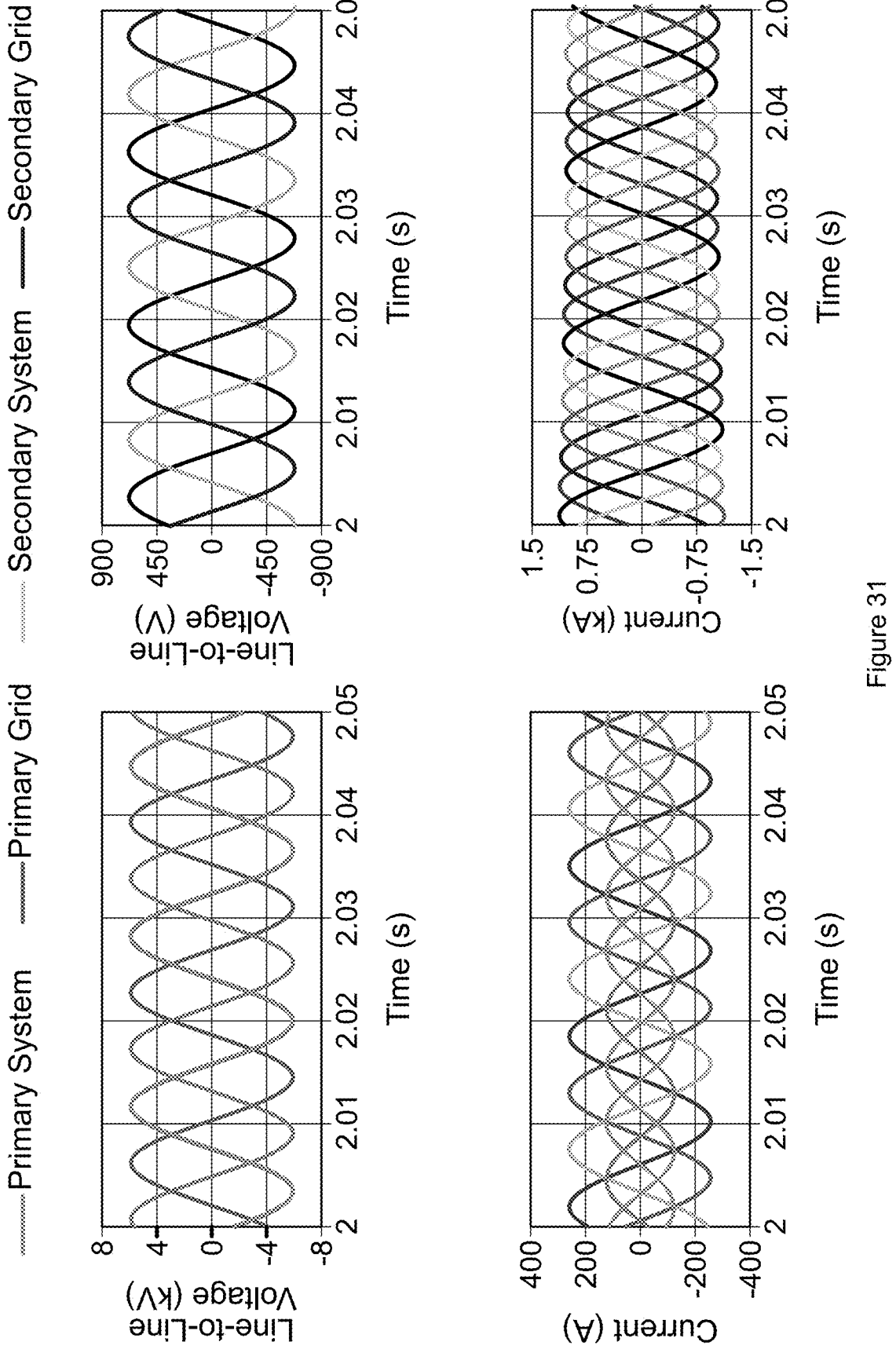
FIG. 31 shows the inset of system-level voltage and current waveforms for three-phase Wye-Wye SST.

A simulation model was constructed for a three-phase SST consisting of 18 modules in a Wyc-Wye configuration. The system connects a 4160V grid on the primary side to a 480V grid on the secondary. Rated system-level power capacity is 1080kVA, or 360 kW per phase. System-level results at the primary and secondary sides are shown in FIG. 29 and FIG. 30, respectively. The dynamic response for the three-phase system is, as expected, identical to the response of the single-phase SST. The three phase legs operate independently, each synchronizing to its respective phase of the primary grid.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims. It is intended that the scope of the invention be defined by the claims appended hereto. The entire disclosures of all references, applications, patents and publications cited above are hereby incorporated by reference.

In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A solid state transformer, comprising:
a system controller; and
a module controller;
   wherein the system controller generates a module operational setpoint that is provided to the module controller to derive switching signals for a switching module; and
   wherein the switching module uses a low bandwidth signal, the low bandwidth signal is between 10-300 Hz.

2. The transformer of claim 1, wherein the switching frequency of the switching module operating between 10-100 kHz.

3. The transformer of claim 1, wherein the switching module comprises a collection of switches, passive components and a high frequency transformer.

4. The transformer of claim 1, wherein the module operational setpoint is selected from voltage, power, current, reactive power.

5. The transformer of claim 1, wherein the transformer comprises a hierarchical control architecture that enables stable operation of paralleled and/or series-connected heterogeneous modules in a common system.

6. The transformer of claim 1, wherein the transformer achieves flexibility in voltage and current rating by interconnection of multiple lower rated modules cascaded in series for higher voltage operation or in parallel for higher current operation.

7. The transformer of claim 1, wherein there are two or more module controllers.

8. A solid-state substation comprising the solid state transformer of claim 1.

9. A method of controlling power distribution within a power distribution system, comprising:
   distributing at one or more nodes in the power distribution system a solid state transformer comprising a hierarchical control architecture that enables the stable operation of paralleled and/or series-connected heterogeneous modules in a common system by distributing module-specific (fast-time) controls to individual modules while system-level behavior (slow-time) response is centralized.

10. The method of claim 8, wherein distributing module-specific controls is at 10-100 kHz.

11. The method of claim 8, wherein system-level behavior response is at 10-300 Hz.

* * * * *